United States Patent
Anderson

(10) Patent No.: US 11,736,125 B2
(45) Date of Patent: *Aug. 22, 2023

(54) ACCELERATED ERASURE CODING SYSTEM AND METHOD

(71) Applicant: STREAMSCALE, INC., Waco, TX (US)

(72) Inventor: Michael H. Anderson, Udon Thani (TH)

(73) Assignee: STREAMSCALE, INC., Waco, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/744,329

(22) Filed: May 13, 2022

(65) Prior Publication Data

US 2022/0271777 A1  Aug. 25, 2022

Related U.S. Application Data

(63) Continuation of application No. 16/855,910, filed on Apr. 22, 2020, now Pat. No. 11,362,678, which is a
(Continued)

(51) Int. Cl.
*H03M 13/15* (2006.01)
*G11C 29/52* (2006.01)
(Continued)

(52) U.S. Cl.
CPC ....... *H03M 13/154* (2013.01); *G06F 11/1068* (2013.01); *G06F 11/1076* (2013.01);
(Continued)

(58) Field of Classification Search
CPC ........... H03M 13/154; H03M 13/1191; H03M 13/134; H03M 13/1515; H03M 13/373;
(Continued)

(56) References Cited

U.S. PATENT DOCUMENTS 4,413,339 A  11/1983  Riggle et al.
4,416,010 A  11/1983  Hibino et al.
(Continued)

FOREIGN PATENT DOCUMENTS

CN  101834615 A  9/2010
CN  101431339 B  6/2011
(Continued)

OTHER PUBLICATIONS

Petition for Inter Partes Review of U.S. Pat. No. 8,683,296 Challenging Claims 1-12, 14-17; Case No. IPR2021-01330, Nov. 23, 2021 (89 sheets).
(Continued)

*Primary Examiner* — John J Tabone, Jr.
(74) *Attorney, Agent, or Firm* — Lewis Roca Rothgerber Christie LLP

(57) ABSTRACT

An accelerated erasure coding system includes a processing core for executing computer instructions and accessing data from a main memory, and a non-volatile storage medium for storing the computer instructions. The processing core, storage medium, and computer instructions are configured to implement an erasure coding system, which includes: a data matrix for holding original data in the main memory; a check matrix for holding check data in the main memory; an encoding matrix for holding first factors in the main memory, the first factors being for encoding the original data into the check data; and a thread for executing on the processing core. The thread includes: a parallel multiplier for concurrently multiplying multiple entries of the data matrix by a single entry of the encoding matrix; and a first sequencer for ordering operations through the data matrix and the encoding matrix using the parallel multiplier to generate the check data.

18 Claims, 9 Drawing Sheets

Related U.S. Application Data continuation of application No. 16/358,602, filed on Mar. 19, 2019, now Pat. No. 10,666,296, which is a continuation of application No. 15/976,175, filed on May 10, 2018, now Pat. No. 10,291,259, which is a continuation of application No. 15/201,196, filed on Jul. 1, 2016, now Pat. No. 10,003,358, which is a continuation of application No. 14/852,438, filed on Sep. 11, 2015, now Pat. No. 9,385,759, which is a continuation of application No. 14/223,740, filed on Mar. 24, 2014, now Pat. No. 9,160,374, which is a continuation of application No. 13/341,833, filed on Dec. 30, 2011, now Pat. No. 8,683,296.

(51) Int. Cl.
*G06F 11/10* (2006.01)
*H03M 13/11* (2006.01)
*H03M 13/13* (2006.01)
*G06F 12/02* (2006.01)
*G06F 12/06* (2006.01)
*H03M 13/37* (2006.01)
*H04L 1/00* (2006.01)
*H03M 13/00* (2006.01)

(52) U.S. Cl.
CPC ...... *G06F 11/1092* (2013.01); *G06F 11/1096* (2013.01); *G06F 12/0238* (2013.01); *G06F 12/06* (2013.01); *G11C 29/52* (2013.01); *H03M 13/1191* (2013.01); *H03M 13/134* (2013.01); *H03M 13/1515* (2013.01); *H03M 13/373* (2013.01); *H03M 13/3761* (2013.01); *H03M 13/3776* (2013.01); *H03M 13/616* (2013.01); *H03M 13/6502* (2013.01); *H04L 1/0043* (2013.01); *H04L 1/0057* (2013.01); *G06F 2211/109* (2013.01); *G06F 2211/1057* (2013.01)

(58) Field of Classification Search
CPC ......... H03M 13/3761; H03M 13/3776; H03M 13/616; H03M 13/6502; G06F 11/1068; G06F 11/1076; G06F 11/1092; G06F 11/1096; G06F 12/0238; G06F 12/06; G06F 2211/1057; G06F 2211/109; G11C 29/52; H04L 1/0043; H04L 1/0057
USPC ..... 714/764, 6.24, 6.1, 6.11, 6.2, 6.21, 6.32, 714/763, 752, 758, 768, 770, 773, 784, 714/786
See application file for complete search history.

(56) References Cited

U.S. PATENT DOCUMENTS

| | | | |
|---|---|---|---|
| 4,856,003 | A | 8/1989 | Weng |
| 5,226,002 | A | 7/1993 | Wu et al. |
| 5,263,030 | A | 11/1993 | Rotker et al. |
| 5,274,645 | A | 12/1993 | Idleman et al. |
| 5,577,054 | A | 11/1996 | Pharris |
| 5,668,976 | A | 9/1997 | Zook |
| 5,712,861 | A | 1/1998 | Inoue et al. |
| 5,754,563 | A | 5/1998 | White |
| 5,912,905 | A | 6/1999 | Sakai et al. |
| 5,999,959 | A | 12/1999 | Weng et al. |
| 6,006,318 | A | 12/1999 | Hansen et al. |
| 6,138,125 | A | 10/2000 | DeMoss |
| 6,163,871 | A | 12/2000 | Yang |
| 6,195,744 | B1 | 2/2001 | Favor et al. |
| 6,263,470 | B1 | 7/2001 | Hung et al. |
| 6,327,690 | B1 | 12/2001 | Zhang et al. |
| 6,353,909 | B1 | 3/2002 | Amrany et al. |
| 6,486,803 | B1 | 11/2002 | Luby et al. |
| 6,574,774 | B1 | 6/2003 | Vasiliev |
| 6,628,140 | B2 | 9/2003 | Langhammer et al. |
| 6,654,924 | B1* | 11/2003 | Hassner ............ G11B 20/1813 714/758 |
| 6,694,479 | B1 | 2/2004 | Murthy et al. |
| 6,810,499 | B2 | 10/2004 | Sridharan et al. |
| 6,823,425 | B2* | 11/2004 | Ghosh ................ G06F 11/1076 711/114 |
| 7,095,414 | B2 | 8/2006 | Lindholm et al. |
| 7,177,891 | B2 | 2/2007 | Stein et al. |
| 7,178,091 | B1 | 2/2007 | Alon |
| 7,219,289 | B2 | 5/2007 | Dickson |
| 7,275,198 | B2 | 9/2007 | Kim et al. |
| 7,313,583 | B2 | 12/2007 | Porten et al. |
| 7,343,389 | B2 | 3/2008 | Macy et al. |
| 7,350,126 | B2* | 3/2008 | Winograd ........... G06F 11/1076 714/752 |
| 7,403,964 | B2 | 7/2008 | Porten et al. |
| 7,404,134 | B2 | 7/2008 | Le Bars et al. |
| 7,624,255 | B1 | 11/2009 | Rouet et al. |
| 7,669,107 | B2 | 2/2010 | Forhan et al. |
| 7,676,735 | B2 | 3/2010 | Luby et al. |
| 7,739,319 | B2 | 6/2010 | Macy, Jr. et al. |
| 7,783,600 | B1 | 8/2010 | Spertus et al. |
| 7,865,798 | B2 | 1/2011 | Pomerantz |
| 7,865,809 | B1 | 1/2011 | Lee et al. |
| 7,930,337 | B2 | 4/2011 | Hasenplaugh et al. |
| 7,954,040 | B2 | 5/2011 | Hu et al. |
| 7,979,711 | B2 | 7/2011 | Margolus et al. |
| 8,037,391 | B2 | 10/2011 | Jung et al. |
| 8,042,025 | B2 | 10/2011 | Gopal et al. |
| 8,086,937 | B2 | 12/2011 | Sim-Tang et al. |
| 8,095,859 | B1 | 1/2012 | Peterson et al. |
| 8,127,212 | B2 | 2/2012 | Wylie et al. |
| 8,145,941 | B2* | 3/2012 | Jacobson ............ G06F 11/1076 714/6.24 |
| 8,150,031 | B2 | 4/2012 | Gueron |
| 8,171,373 | B2 | 5/2012 | Moriwaki |
| 8,176,265 | B2 | 5/2012 | Coon et al. |
| 8,214,626 | B2 | 7/2012 | Macy, Jr. et al. |
| 8,250,427 | B2 | 8/2012 | Wylie et al. |
| 8,296,515 | B1 | 10/2012 | Saxena et al. |
| 8,312,356 | B1 | 11/2012 | Cousins |
| 8,316,277 | B2 | 11/2012 | Flynn et al. |
| 8,327,242 | B1 | 12/2012 | Anholt et al. |
| 8,352,847 | B2* | 1/2013 | Gunnam ............ H03M 13/1102 714/801 |
| 8,392,805 | B2 | 3/2013 | Wylie et al. |
| 8,418,021 | B2 | 4/2013 | Lin et al. |
| 8,429,489 | B2 | 4/2013 | Vityaev |
| 8,429,508 | B2 | 4/2013 | Kondo et al. |
| 8,458,287 | B2 | 6/2013 | Ozzie et al. |
| 8,468,434 | B2 | 6/2013 | Toda |
| 8,473,778 | B2 | 6/2013 | Simitci et al. |
| 8,533,555 | B2 | 9/2013 | Chen et al. |
| 8,626,820 | B1 | 1/2014 | Levy |
| 8,631,269 | B2 | 1/2014 | Vinayak et al. |
| 8,645,798 | B2 | 2/2014 | Pruthi |
| 8,650,471 | B2 | 2/2014 | Kotzur et al. |
| 8,683,296 | B2* | 3/2014 | Anderson ............ H04L 1/0043 714/763 |
| 8,694,858 | B2 | 4/2014 | Kong et al. |
| 8,707,143 | B2 | 4/2014 | Langhammer |
| 8,726,129 | B1 | 5/2014 | Aguilera et al. |
| 8,782,113 | B2 | 7/2014 | Schnapp et al. |
| 8,839,072 | B2 | 9/2014 | Uchida et al. |
| 8,839,078 | B2 | 9/2014 | Abu-Surra et al. |
| 8,856,613 | B2 | 10/2014 | Sakaue et al. |
| 8,862,968 | B1 | 10/2014 | Johnston |
| 8,868,889 | B2 | 10/2014 | Mital et al. |
| 8,879,725 | B2 | 11/2014 | Gueron et al. |
| 8,886,994 | B2 | 11/2014 | Czajkowski |
| 8,914,706 | B2* | 12/2014 | Anderson ............ G06F 11/1076 714/763 |
| 9,160,374 | B2* | 10/2015 | Anderson ............ G06F 11/1092 |
| 9,223,580 | B2 | 12/2015 | Eichenberger et al. |
| 9,258,014 | B2* | 2/2016 | Anderson ............ H03M 13/154 |
| 9,385,759 | B2 | 7/2016 | Anderson |

(56) References Cited

U.S. PATENT DOCUMENTS

| | | | |
|---|---|---|---|
| 9,600,281 | B2 | 3/2017 | Eichenberger et al. |
| 9,667,272 | B1 | 5/2017 | Gunnam et al. |
| 9,727,414 | B2 | 8/2017 | Cohen |
| 9,760,439 | B2* | 9/2017 | Anderson ........... H03M 13/158 |
| 10,003,358 | B2 | 6/2018 | Anderson |
| 10,536,167 | B2 | 1/2020 | Pavlov et al. |
| 10,664,347 | B2* | 5/2020 | Anderson .......... H03M 13/1191 |
| 10,725,884 | B2 | 7/2020 | De Schrijver et al. |
| 2004/0054877 | A1 | 3/2004 | Macy, Jr. et al. |
| 2004/0054879 | A1 | 3/2004 | Macy, Jr. et al. |
| 2004/0170201 | A1 | 9/2004 | Kubo et al. |
| 2004/0180501 | A1 | 9/2004 | Liu |
| 2004/0216125 | A1 | 10/2004 | Gazda et al. |
| 2005/0004966 | A1 | 1/2005 | Fan |
| 2006/0212780 | A1 | 9/2006 | Ohira et al. |
| 2007/0055905 | A1 | 3/2007 | Chou et al. |
| 2007/0245083 | A1 | 10/2007 | Margolus et al. |
| 2008/0109707 | A1 | 5/2008 | Dell et al. |
| 2009/0019333 | A1 | 1/2009 | McEvoy et al. |
| 2009/0055717 | A1 | 2/2009 | Au et al. |
| 2009/0106625 | A1 | 4/2009 | Jun et al. |
| 2009/0106633 | A1 | 4/2009 | Fujiwara et al. |
| 2009/0199075 | A1 | 8/2009 | Demjanenko et al. |
| 2009/0220071 | A1 | 9/2009 | Gueron et al. |
| 2009/0249162 | A1 | 10/2009 | Tjhai et al. |
| 2009/0249170 | A1 | 10/2009 | Maiuzzo |
| 2010/0158241 | A1 | 6/2010 | Gueron |
| 2010/0218037 | A1 | 8/2010 | Swartz et al. |
| 2010/0235677 | A1 | 9/2010 | Wylie et al. |
| 2010/0293439 | A1 | 11/2010 | Flynn et al. |
| 2011/0029729 | A1 | 2/2011 | Zwisler et al. |
| 2011/0029756 | A1* | 2/2011 | Biscondi ........... H03M 13/3715 712/22 |
| 2011/0252000 | A1 | 10/2011 | Diaconu et al. |
| 2012/0221539 | A1 | 8/2012 | Rose et al. |
| 2012/0221540 | A1 | 8/2012 | Rose et al. |
| 2012/0272036 | A1* | 10/2012 | Muralimanohar ...... G06F 12/06 711/202 |
| 2013/0108048 | A1* | 5/2013 | Grube ................... H04L 1/0057 380/270 |
| 2013/0110962 | A1* | 5/2013 | Grube ................... H04L 1/0057 709/213 |
| 2013/0111552 | A1* | 5/2013 | Grube ................... H04L 1/0057 726/3 |
| 2013/0124932 | A1* | 5/2013 | Schuh ..................... G11C 29/08 714/718 |
| 2013/0173956 | A1* | 7/2013 | Anderson ............... G06F 12/06 714/6.24 |
| 2013/0173996 | A1* | 7/2013 | Anderson ............. H04L 1/0043 714/770 |
| 2013/0290943 | A1 | 10/2013 | Uliel et al. |
| 2013/0339682 | A1 | 12/2013 | Uliel et al. |
| 2014/0006753 | A1 | 1/2014 | Gopal et al. |
| 2014/0016774 | A1 | 1/2014 | Wolrich et al. |
| 2014/0040708 | A1 | 2/2014 | Maiuzzo |
| 2014/0068391 | A1 | 3/2014 | Goel et al. |
| 2015/0012796 | A1* | 1/2015 | Anderson ........... G06F 11/1068 714/763 |
| 2016/0026574 | A1 | 1/2016 | Frank et al. |
| 2017/0005671 | A1 | 1/2017 | Anderson |
| 2019/0205210 | A1* | 7/2019 | Anderson ......... H03M 13/1515 |
| 2019/0215013 | A1* | 7/2019 | Anderson ........... G06F 11/1068 |
| 2020/0250035 | A1* | 8/2020 | Anderson ............. H04L 1/0043 |
| 2020/0295784 | A1* | 9/2020 | Anderson ........... H03M 13/373 |

FOREIGN PATENT DOCUMENTS

| | | |
|---|---|---|
| CN | 101217337 B | 1/2013 |
| EP | 0 753 942 A2 | 1/1997 |
| EP | 1 017 177 B1 | 5/2004 |
| EP | 2 096 786 A2 | 9/2009 |
| EP | 2 515 235 A3 | 7/2013 |
| JP | H07-226687 A | 8/1995 |
| KR | 10-0193732 B1 | 6/1999 |
| KR | 10-0322739 B1 | 6/2002 |
| KR | 10-2011-0122489 A | 11/2011 |
| WO | WO 91/13404 A1 | 9/1991 |
| WO | WO 03/107122 A2 | 12/2003 |
| WO | WO 2004/019268 A1 | 3/2004 |
| WO | WO 2006/120691 A1 | 11/2006 |
| WO | WO 2007/128168 A1 | 11/2007 |
| WO | WO 2010/080263 A2 | 7/2010 |
| WO | WO 2013/095493 A1 | 6/2013 |

OTHER PUBLICATIONS

Declaration of Stephen Wicker, Ph.D., U.S. Pat. No. 8,683,296 Challenging Claims 1-12, 14-17, Case No. IPR2021-01330 Exhibit 1002, Nov. 22, 2021 (153 sheets).

Petition for Inter Partes Review of U.S. Pat. No. 8,683,296 Challenging Claims 23-27, 29-32, and 34-39; Case No. IPR2021-01408, Nov. 23, 2021 (87 sheets).

Declaration of Stephen Wicker, Ph.D., U.S. Pat. No. 8,683,296 Challenging Claims 23-27, 29-32 and 34-34, Case No. IPR2021-01408 Exhibit 1102, Nov. 22, 2021 (147 sheets).

Petitioner's Reasons for Parallel Petitions and Petition Ranking U.S. Pat. No. 8,683,296, Case Nos. IPR2021-01330 and IPR2021-01408, Nov. 23, 2021 (6 sheets).

Plank, James S., "*A Tutorial on Reed-Solomon Coding for Fault-Tolerance in RAID-like Systems*" Software: Practice and Experience, vol. 27, No. 9 (Sep. 1997): 995-1012.

Li, Han et al., "*Parallelized Network Coding with SIMD Instruction Sets*" In Proceedings: International Symposium on Computer Science and Computational Technology (vol. 1, pp. 364-369). 2 vols. ISCSCT 2008. Piscataway, NJ: IEEE Computer Society, 2008.

Patterson, David A., et al., "*Computer Organization and Design: The Hardware / Software Interface*" 4th ed. San Francisco, CA: Morgan Kaufmann, 2009, excerpts from Chapters 1 and 4-6 (80 sheets).

Plank, James S. "*T1: Erasure Codes for Storage Applications*"Tutorial presented at the 4th USENIX Conference on File and Storage Technologies, 2005 (74 sheets).

Plank, James S., et al., "*Note: Correction to the 1997 tutorial on Reed-Solomon Coding*" Software: Practice and Experience, vol. 35, issue 2 (Feb. 2005) 189-194.

Google Scholar entry for Plank, James S., "*A Tutorial on Reed-Solomon Coding for Fault-Tolerance in RAID-like Systems*", accessed Nov. 11, 2021 (1 sheet).

Declaration of Gordon MacPherson, dated Jul. 14, 2021, regarding Li, Han et al., "*Parallelized Network Coding with SIMD Instruction Sets*" (12 sheets).

Declaration of Duncan Hall dated Aug. 2, 2021 regarding Plank, James S. "*T1: Erasure Codes for Storage Applications*" https://web.archive.org/web/20060716124538/http://www.cs.utk.edu/~plank/plank/papers/FAST-2005.html (82 sheets).

Declaration of Dr. Sylvia Hall-Ellis, Case No. IPR2021-01330 Exhibit 1014, Nov. 18, 2021 (114 sheets).

Declaration of Duncan Hall dated Jun. 14, 2021 regarding Anvin, H. Peter, "The mathematics of RAID-6" (May 21, 2009), https://web.archive.org/web/20100613071746/http://kernel.org/pub/linux/kernel/people/hpa/raid6.pdf (14 sheets).

Wicker, Stephen B., "*Error Control Systems for Digital Communication and Storage*" School of Electrical and Computer Engineering Georgia Institute of Technology (1995) (79 sheets).

Moreira, Jorge Castiñeira, et al., "*Essentials of Error-Control Coding*", Wiley (2006) (5 sheets).

Affidavit of Duncan Hall dated Oct. 4, 2021 regarding Intel® 64 and IA-32 Architectures Software Developer's Manual, vol. 1: Basic Architecture (Sep. 2009), https://web.archive.org/web/20091123011521/http://developer.intel.com/Assets/PDF/manual/253665.pdf (504 sheets).

Complaint for Patent Infringement, *StreamScale, Inc.* v. *Cloudera, Inc.* et al., Case No. 6:21-cv-198 (W.D. Tex.) Mar. 2, 2021 (74 sheets).

Amended Complaint for Patent Infringement, *StreamScale, Inc.* v. *Cloudera, Inc.* et al., Case No. 6:21-cv-198 (W.D. Tex.) May 28, 2021 (90 sheets).

(56) References Cited

OTHER PUBLICATIONS

Second Amended Complaint for Patent Infringement, *StreamScale, Inc. v. Cloudera, Inc et al.*, Case No. 6:21-cv-198 (W.D. Tex.) Jul. 26, 2021 (350 sheets).
Preliminary Infringement Contentions, *StreamScale, Inc. v. Cloudera, Inc. et al.*, Case No. 6:21-cv-198 (W.D. Tex.) Jul. 15, 2021 (6 sheets).
Defendants' Redacted Preliminary Invalidity Contentions, *StreamScale, Inc. v. Cloudera, Inc. et al.*, Case No. 6:21-cv-198 (W.D. Tex.) Nov. 9, 2021 (235 sheets).
Anvin, H. Peter, "*The mathematics of RAID-6*", First Version Jan. 20, 2004; Last Updated May 21, 2009; pp. 1-10.
Anvin, H. Peter, "*The mathematics of RAID-6*", Dec. 1, 2004; pp. 1-8.
Nagarajan, Aishwarya et al., "*Galois Field Hardware Architectures for Network Coding*", 2010 ACM/IEEE Symposium on Architectures for Networking and Communications Systems (ANCS) 2010 (pp. 1-9). IEEE.
Aoki, Kazumaro et al., "*Byte Slicing GRØSTL Optimized Intel AES-NI and 8-bit Implementations of the SHA-3 Finalist Grøstl*", Proceedings of the International Conference on Security and Cryptography (SECRYPT-2011), pp. 124-133.
Brumley, Billy Bob et al., "*Bit-sliced Binary Normal Basis Multiplication*", 2011 20th IEEE Symposium on Computer Arithmetic (2011) pp. 205-212.
Bhaskar, Raghav et al., "*Efficient Galois Field Arithmetic on SIMD Architectures*", Proceedings of the Fifteenth Annual ACM Symposium on Parallel Algorithms and Architectures, (SPAA'03) Jun. 7-9, 2003, pp. 256-257.
T. Chen, et al. "*Cell Broadband Engine Architecture and its first implementation—A performance view*", IBM J. Res. & Dev. vol. 51 No. Sep. 5, 2007, pp. 559-572.
Costa, Lauro B. et al., "*GPU Support for Batch Oriented Workloads*", 2009 IEEE 28th International Performance Computing and Communications Conference (2009) pp. 231-238.
Curry, Matthew L., "*A Highly Reliable GPU-Based Raid System*", A Dissertation Submitted to the graduate faculty of The University of Alabama at Birmingham, in partial fulfillment of the requirements for the degree of Doctor of Philosophy (2010) pp. 1-141.
Curry, Matthew L., et al., "*Arbitrary Dimension Reed-Solomon Coding and Decoding for Extended RAID on GPUs*", CSRI Summer Proceedings 2008, The Computer Science Research Institute at Sandia National Laboratories, Dec. 11, 2008, pp. 167-174.
Didier, Frédéric, "*Efficient erasure decoding of Reed-Solomon codes*", arXiv:0901.1886v1 [cs.IT], Jan. 14, 2009, Computing Research Repository (CoRR) (4 sheets).
Dimakis, Alexandros G., et al., "*Network Coding for Distributed Storage Systems*", INFOCOM 2007, 26th IEEE International Conference on Computer Communications, Joint Conference of the IEEE Computer and Communications Societies, May 6-12, 2007, Anchorage, Alaska, USA (10 sheets).
Hafner, James Lee, "*WEAVER Codes: Highly Fault Tolerant Erasure Codes for Storage Systems*", FAST '05: 4th USENIX Conference on File and Storage Technologies (2005) pp. 211-224.
IEEE Xplore References for Chen, Y. H., et al. "Robustness file copy up into cloud storage service" IEEE.org, Nov. 14, 2017 (3 sheets).
Intel 64 and IA-32 Architectures Software Developer's Manual vol. 1: Basic Architecture, Order No. 253665-032US, Sep. 2009 (500 sheets).
Khan, Osama et al., "*In Search of I/O-Optimal Recovery from Disk Failures*", Hot Storage '11: 3rd USENIX Workshop on Hot Topics in Storage and File Systems, Portland, OR, Jun. 2011 (5 sheets).
Kumar, Akash et al., "*Vectorization of Reed Solomon Decoding and Mapping on the EVP*", 2008 Design, Automation and Test in Europe (2008) pp. 450-455.
Luby, Michael G. et al., "Efficient Erasure Correcting Codes", IEEE Transactions on Information Theory, vol. 47, No. 2, Feb. 2001, pp. 569-584.

Curry, Matthew L. et al., "*A Lightweight, GPU-Based Software Raid System*", CSRI Summer Proceedings 2010, The Computer Science Research Institute at Sandia National Laboratories, Dec. 17, 2010, pp. 297-308.
Klein, Henning et al., "*Optimizing a Highly Fault Tolerant Software RAID for Many Core Systems*", 2009 International Conference on High Performance Computing & Simulation (2009) pp. 74-79.
Paolini, Enrico et al., "*Construction of Near-Optimum Burst Erasure Correcting Low-Density Parity-Check Codes*", arXiv:0810.1197 [cs.IT], Oct. 7, 2008, Computing Research Repository (CoRR) (15 sheets).
Plank, James S., "*Jerasure: A Library in C/C++ Facilitating Erasure Coding for Storage Applications*", Technical Report CS-07-603 (Revision 1.0), Department of Electrical Engineering and Computer Science, University of Tennessee, Sep. 2007, pp. 1-32.
Plank, James S., "*A New Minimum Density RAID-6 Code with a Word Size of Eight*", Technical Report CS-08-612, Department of Electrical Engineering and Computer Science, University of Tennessee, Apr. 2008 (19 sheets).
Klein, Henning et al., "*RAID Architecture with Correction of Corrupted Data in Faulty Disk Blocks*", $22^{nd}$ International Conference on Architecture of Computing Systems 2009, 2009, pp. 1-4.
Mamidi, Suman et al., "*Instruction Set Extensions for Reed-Solomon Encoding and Decoding*", 2005 IEEE International Conference on Application-Specific Systems, Architecture Processors (ASAP'05), 2005, pp. 364-369.
Lee, Seung-Hoon et al., "*Content Distribution in VANETs Using Network Coding: The Effect of Disk I/O and Processing O/H*", 2008 5th Annual IEEE Communications Society Conference on Sensor, Mesh and Ad Hoc Communications and Networks, 2008, pp. 117-125.
Anvin, H. Peter, "*The mathematics of RAID-6*", Last Updated Mar. 13, 2007; pp. 1-9.
Alvarez, Guillermo A. et al., "*Tolerating Multiple Failures in RAID Architectures with Optimal Storage and Uniform Declustering*", Conference Proceedings. The 24th Annual International Symposium on Computer Architecture, 1997, pp. 62-72.
Wyrzykowski, Roman et al., "*Towards Efficient Execution of Erasure Codes on Multicore Architectures*", Applied Parallel and Scientific Computing—10th International Conference, PARA 2010, Reykjavik, Iceland, Jun. 6-9, 2010, Revised Selected Papers, Part II LNCS 7134 (2012) pp. 357-367.
Reed-Solomon Codes and Their Applications, Edited by Stephen B. Wicker and Vijay K. Bhargava, IEEE Press (1994) pp. 1-322 (170 sheets) 4 Parts.
Garcia, Jesus et al., "*A Combined 16-Bit Binary and Dual Galois Field Multiplier*", IEEE Workshop on Signal Processing Systems, 2002, pp. 63-68.
Anastasi, Giuseppe et al., "*A Hybrid Adaptive Protocol for Reliable Data Delivery in WSNs with Multiple Mobile Sinks*", The Computer Journal, vol. 54, No. 2, 2011, pp. 213-229.
Plank, James S., et al. GF-Complete, Revision c25310f, Jun. 16, 2014 (350 sheets) 4 Parts.
Song, Leilei et al., "*Low-Energy Heterogeneous Digit-Serial Reed-Solomon Codecs*", Proceedings of the 1998 IEEE International Conference on Acoustics, Speech and Signal Processing, ICASSP '98 (Cat. No. 98CH36181), 1998, pp. 3049-3052 vol. 5.
Yang, Shenglin et al., "*Microcoded Coprocessor for Embedded Secure Biometric Authentication Systems*", 2005 Third IEEE/ACM/IFIP International Conference on Hardware/Software Codesign and System Synthesis (CODES+ISSS'05), 2005, pp. 130-135.
Plank, James S. et al., "*Screaming Fast Galois Field Arithmetic Using Intel SIMD Instructions*", 11th USENIX Conference on File and Storage Technologies (FAST '13), Feb. 2013, pp. 299-306.
Tong, Po et al., "*Sequential Encoding of Reed-Solomon Codes Using Discrete-Time Delay Lines*", IEEE Transactions on Communications, vol. 42, No. 1, Jan. 1994, pp. 2-5.
Al-Kiswany, Samer et al., "*StoreGPU Exploiting Graphics Processing Units to Accelerate Distributed Storage Systems*" Presented at Proceedings of the 17th International Symposium on High Performance Distributed Computing (HPDC '08) Jun. 2008 (35 sheets).

(56) References Cited

OTHER PUBLICATIONS

Patterson, David A. et al., "*Computer Organization and Design The Hardware/Software Interface*" Fourth Edition 2008.
Lee, Hanho "*A High-Speed Low-Complexity Reed-Solomon Decoder for Optical Communications*", IEEE Transactions on Circuits and Systems II: Express Briefs, vol. 52, No. 8, Aug. 2005, pp. 461-465.
Kalcher, Sebastian et al., "*Accelerating Galois Field Arithmetic for Reed-Solomon Erasure Codes in Storage Applications*", 2011 IEEE International Conference on Cluster Computing (2011) pp. 290-298.
Suvakovic, Dusan et al., "*Compact Highly-Utilized Reed Solomon Decoder Architectures for Optical Access Networks*", 2011 IEEE Global Telecommunications Conference—GLOBECOM 2011 (2011) pp. 1-6.
Song, Leilei et al., "*Hardware/Software Codesign of Finite Field Datapath for Low-Energy Reed-Solomon Codecs*", IEEE Transactions on Very Large Scale Integration (VLSI) Systems, vol. 8, No. 2 (Apr. 2000) pp. 160-172.
Jachimiec, Nathan et al., "*Reconfigurable Finite Field Instruction Set Architecture*", FPGA '07: Proceedings of the 2007 ACM/SIGDA 15th International Symposium on Field Programmable Gate Arrays, Feb. 2007, pp. 216-220.
Exhibit A2 Macy Claim Chart of U.S. Pat. No. 8,683,296, Defendants' Redacted Preliminary Invalidity Contentions, *StreamScale, Inc.* v. *Cloudera, Inc.* et al., Case No. 6:21-cv-198 (W.D. Tex.) Nov. 9, 2021 (336 sheets).
Exhibit A3 Anvin Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (62 sheets).
Exhibit A4 Li Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (157 sheets).
Exhibit A5 Curry Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (90 sheets).
Exhibit A6 Intel Basic Architecture 2009 Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (43 sheets).
Exhibit A7 Plank 97 Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (159 sheets).
Exhibit A8 Plank 07 Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (269 sheets).
Exhibit A9 Saxena Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (111 sheets).
Exhibit A10 Swartz Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (105 sheets).
Exhibit A11 Demjanenko Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (56 sheets).
Exhibit A12 Porten Claim Chart of U.S. Pat. No. 8,683,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (44 sheets).
Exhibit B2 Macy Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (286 sheets).
Exhibit B3 Anvin Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (39 sheets).
Exhibit B4 Li Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (89 sheets).
Exhibit B5 Curry Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (64 sheets).
Exhibit B6 Intel Basic Architecture 2009 Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (24 sheets).
Exhibit B7 Plank 97 Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (106 sheets).
Exhibit B8 Plank 07 Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (222 sheets).
Exhibit B9 Saxena Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (25 sheets).
Exhibit B10 Swartz Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (26 sheets).
Exhibit B11 Demjanenko Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (26 sheets).
Exhibit B12 Porten Claim Chart of U.S. Pat. No. 9,160,374, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (23 sheets).
Exhibit C2 Macy Claim Chart of U.S. Pat. No. 9,385,759, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (331 sheets).
Exhibit C3 Anvin Claim Chart of U.S. Pat. No. 9,385,759, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (41 sheets).
Exhibit C4 Li Claim Chart of U.S. Pat. No. 9,385,759, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (108 sheets).
Exhibit C5 Curry Claim Chart of U.S. Pat. No. 9,385,759, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (70 sheets).
Exhibit C6 Intel Basic Architecture 2009 Claim Chart of U.S. Pat. No. 9,385,759, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (27 sheets).
Exhibit C7 Plank 97 Claim Chart of U.S. Pat. No. 9,385,759, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (127 sheets).
Exhibit C8 Plank 07 Claim Chart of U.S. Pat. No. 9,385,759, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (243 sheets).
Exhibit C9 Saxena Claim Chart of U.S. Pat. No. 9,385,759, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (30 sheets).

(56) References Cited

OTHER PUBLICATIONS

Exhibit C10 Swartz Claim Chart of U.S. Pat. No. 9,385,759, Defendants' Redacted Preliminary Invalidity Contentions, StreamScale, Inc. v. Cloudera, Inc. et al., Case No. 6:21-cv-198 (W.D. Tex.) Nov. 9, 2021 (38 sheets).
Exhibit C11 Demjanenko Claim Chart of U.S. Pat. No. 9,385,759, Defendants' Redacted Preliminary Invalidity Contentions, *StreamScale, Inc. v. Cloudera, Inc. et al.*, Case No. 6:21-cv-198 (W.D. Tex.) Nov. 9, 2021 (31 sheets).
Exhibit C12 Porten Claim Chart of U.S. Pat. No. 9,385,759, Defendants' Redacted Preliminary Invalidity Contentions, *StreamScale, Inc. v. Cloudera, Inc. et al.*, Case No. 6:21-cv-198 (W.D. Tex.) Nov. 9, 2021 (25 sheets).
Exhibit D2 Macy Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (470 sheets).
Exhibit D3 Anvin Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (86 sheets).
Exhibit D4 Li Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (172 sheets).
Exhibit D5 Curry Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (120 sheets).
Exhibit D6 Intel Basic Architecture 2009 Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (66 sheets).
Exhibit D7 Plank 97 Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (210 sheets).
Exhibit D8 Plank 07 Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (341 sheets).
Exhibit D9 Saxena Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (137 sheets).
Exhibit D10 Swartz Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (98 sheets).
Exhibit D11 Demjanenko Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (91 sheets).
Exhibit D12 Porten Claim Chart of U.S. Pat. No. 10,003,358, Defendants' Redacted Preliminary Invalidity Contentions, *StreamScale, Inc. v. Cloudera, Inc. et al.*, Case No. 6:21-cv-198 (W.D. Tex.) Nov. 9, 2021 (69 sheets).
Exhibit E2 Macy Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (530 sheets).
Exhibit E3 Anvin Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (91 sheets).
Exhibit E4 Li Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (185 sheets).
Exhibit E5 Curry Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (127 sheets).
Exhibit E6 Intel Basic Architecture 2009 Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (69 sheets).
Exhibit E7 Plank 97 Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (215 sheets).
Exhibit E8 Plank 07 Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (355 sheets).
Exhibit E9 Saxena Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (144 sheets).
Exhibit E10 Swartz Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (107 sheets).
Exhibit E11 Demjanenko Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (91 sheets).
Exhibit E12 Porten Claim Chart of U.S. Pat. No. 10,291,259, Defendants' Redacted Preliminary Invalidity Contentions, *StreamScale, Inc. v. Cloudera, Inc. et al.*, Case No. 6:21-cv-198 (W.D. Tex.) Nov. 9, 2021 (70 sheets).
Exhibit F2 Macy Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (341 sheets).
Exhibit F3 Anvin Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (40 sheets).
Exhibit F4 Li Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (103 sheets).
Exhibit F5 Curry Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (78 sheets).
Exhibit F6 Intel Basic Architecture 2009 Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (25 sheets).
Exhibit F7 Plank 97 Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (133 sheets).
Exhibit F8 Plank 07 Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (219 sheets).
Exhibit F9 Saxena Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (75 sheets).
Exhibit F10 Swartz Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (87 sheets).
Exhibit F11 Demjanenko Claim Chart of U.S. Pat. No. 10,666,296, Defendants' Redacted Preliminary Invalidity Contentions, *StreamScale, Inc. v. Cloudera, Inc. et al.*, Case No. 6:21-cv-198 (W.D. Tex.) Nov. 9, 2021 (40 sheets).

(56) References Cited

OTHER PUBLICATIONS

Exhibit F12 Porten Claim Chart of U.S. Pat. No. 10,666,296, Defendants' Redacted Preliminary Invalidity Contentions, *StreamScale, Inc.* v. *Cloudera, Inc. et al.*, Case No. 6:21-cv-198 (W.D. Tex.) Nov. 9, 2021 (35 sheets).
Intel Corporation gf_v1 Source Code dated Oct. 28, 2010 (4 sheets).
Casey Henderson: Letter to the USENIX Community <https://www.usenix.org/system/files/conference/fast13/fast13_memo_021715.pdf> Feb. 17, 2015.
Chandan Kumar Singh: EC Jerasure plugin and StreamScale Inc, <http://www.spinics.net/lists/ceph-devel/msg29944.html> Apr. 20, 2016.
Code Poetry and Text Adventures: <http://catid.mechafetus.com/news/news.php?view=381> Dec. 14, 2014.
Curtis Chan: StreamScale Announces Settlement of Erasure Code Technology Patent Litigation, <http://www.prweb.com/releases/2014/12/prweb12368357.htm>, Dec. 3, 2014.
Ethan Miller, <https://plus.google.com/113956021908222328905/posts/bPcYevPkJWd>, Aug. 2, 2013.
H. Peter Anvin. "The mathematics of RAID-6." 2004, 2011.
Hafner et al., Matrix Methods for Lost Data Reconstruction in Erasure Codes, Nov. 16, 2005, USENIX Fast '05 Paper, pp. 1-26.
James S. Plank, Ethan L. Miller, Will B. Houston: GF-Complete: A Comprehensive Open Source Library for Galois Field Arithmetic, <http://web.eecs.utk.edu/~plank/plank/papers/CS-13-703.html> Jan. 2013.
James S. Plank, Jianqiang Luo, Catherine D. Schuman, Lihao Xu, Zooko Wlcox-O'Hearn: A Performance Evaluation and Examination of Open-Source Erasure Coding Libraries For Storage, <https://www.usenix.org/legacy/event/fast09/tech/full_papers/plank/plank_html/> 2009.
Kevin M. Greenan, Ethan L. Miller, Thomas J.E. Schwarz, S. J.: Optimizing Galois Field Arithmetic for Diverse Processor Architectures and Applications, *Proceedings of the 16th IEEE International Symposium on Modeling, Analysis, and Simulation of Computer and Telecommunication Systems (MASCOTS 2008)*, Baltimore, MD, Sep. 2008.
Lee, "*High-Speed VLSI Architecture for Parallel Reed-Solomon Decoder*", IEEE Transactions on Very Large Scale Integration (VLSI) Systems, vol. 11, No. 2, Apr. 2003, pp. 288-294.
Li et al.; Preventing Silent Data Corruptions from Propagating During Data Reconstruction; IEEE Transactions on Computers, vol. 59, No. 12, Dec. 2010; pp. 1611-1624.
Loic Dachary: Deadline of Github pull request for Hammer release, <http://www.spinics.net/lists/ceph-devel/msg22001.html> Jan. 13, 2015.
Louis Lavile: <https://twitter.com/louislavile> Nov. 13, 2014.
M. Lalam, et al. "Sliding Encoding-Window for Reed-Solomon code decoding," 4th International Symposium on Turbo Codes & Related Topics; 6th International ITG-Conference on Source and Channel Coding, Munich, Germany, 2006, pp. 1-6.

Maddock, et al.; White Paper, Surviving Two Disk Failures Introducing Various "RAID 6" Implementations; Xyratex; pp. 1-13.
Mann, "*The Original View of Reed-Solomon Coding and the Welch-Berlekamp Decoding Algorithm*", A Dissertation Submitted to the Faculty of the Graduate Interdisciplinary Program in Applied Mathematics, The University of Arizona, Jul. 19, 2013, 143 sheets.
Marius Gedminas: <http://eavesdrop.openstack.org/irclogs/%23openstack-swift/%23openstack-swift.2015-04-30.log.html> Apr. 29, 2015.
Matthew L. Curry, Anthony Skjellum, H. Lee Ward, and Ron Brightwell. "Arbitrary dimension reed-solomon coding and decoding for extended raid on gpus." In *Petascale Data Storage Workshop, 2008. PDSW'08. 3rd*, pp. 1-3. IEEE, 2008.
Matthew L. Curry, Anthony Skjellum, H. Lee Ward, Ron Brightwell: Gibraltar: A Reed-Solomon coding library for storage applications on programmable graphics processors. *Concurrency and Computation: Practice and Experience* 23(18): pp. 2477-2495 (2011).
Matthew L. Curry, H. Lee Ward, Anthony Skjellum, Ron Brightwell: A Lightweight, GPU-Based Software RAID System. ICPP 2010: pp. 565-572.
Matthew L. Curry, Lee H. Ward, Anthony Skjellum, and Ron B. Brightwell: Accelerating Reed-Solomon Coding in RAID Systems With GPUs, *Parallel and Distributed Processing, 2008. IPDPS 2008. IEEE International Symposium on*. IEEE, 2008.
Michael A. O'Shea: StreamScale, <https://lists.ubuntu.com/archives/technical-board/2015-April/002100.html> Apr. 29, 2015.
Mike Masnik: Patent Troll Kills Open Source Project On Speeding Up The Computation Of Erasure Codes, <https://www.techdirt.com/articles/20141115/07113529155/patent-troll-kills-open-source-proiect-speeding-up-computation-erasure-codes.shtml>, Nov. 19, 2014.
Neifeld, M.A & Sridharan, S. K. (1997). Parallel error correction using spectral Reed-Solomon codes. Journal of Optical Communications, 18(4), pp. 144-150.
Plank; All About Erasure Codes:—Reed-Solomon Coding—LDPC Coding; Logistical Computing and Internetworking Laboratory, Department of Computer Science, University of Tennessee; ICL— Aug. 20, 2004; 52 sheets.
Robert Louis Cloud, Matthew L. Curry, H. Lee Ward, Anthony Skjellum, Purushotham Bangalore: Accelerating Lossless Data Compression with GPUs. CoRR abs/1107.1525 (2011).
Roy Schestowitz: US Patent Reform (on Trolls Only) More or Less Buried or Ineffective, <http://techrights.org/2014/12/12/us-patent-reform/> Dec. 12, 2014.
Weibin Sun, Robert Ricci, Matthew L. Curry: GPUstore: harnessing GPU computing for storage systems in the OS kernel. *SYSTOR 2012*: p. 6.
Xin Zhou, Anthony Skjellum, Matthew L. Curry: Abstract: Extended Abstract for Evaluating Asynchrony in Gibraltar RAID's GPU Reed-Solomon Coding Library. *SC Companion 2012*: pp. 1496-1497.
Xin Zhou, Anthony Skjellum, Matthew L. Curry: Poster: Evaluating Asynchrony in Gibraltar RAID's GPU Reed-Solomon Coding Library. *SC Companion 2012*: p. 1498.

* cited by examiner

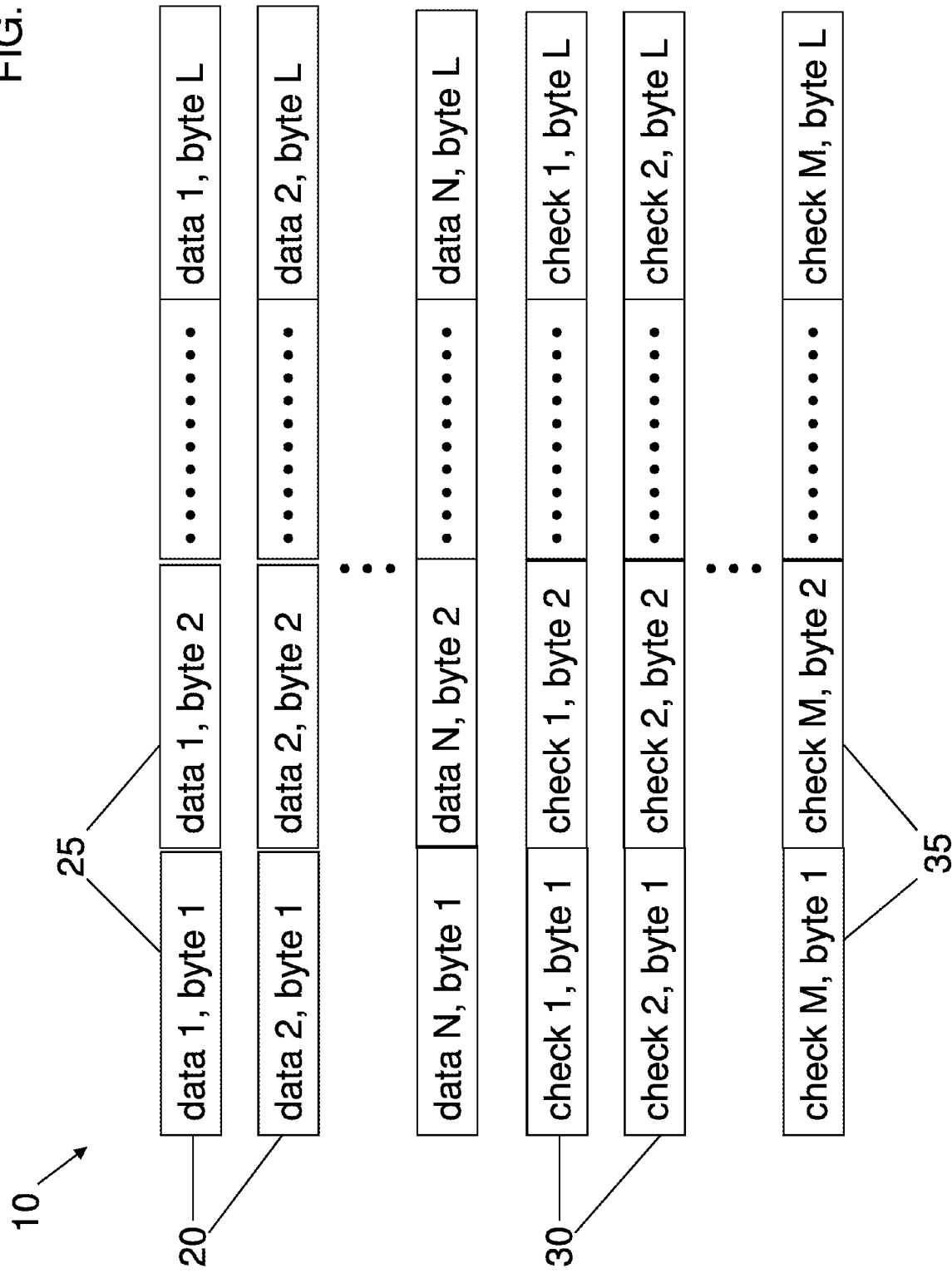

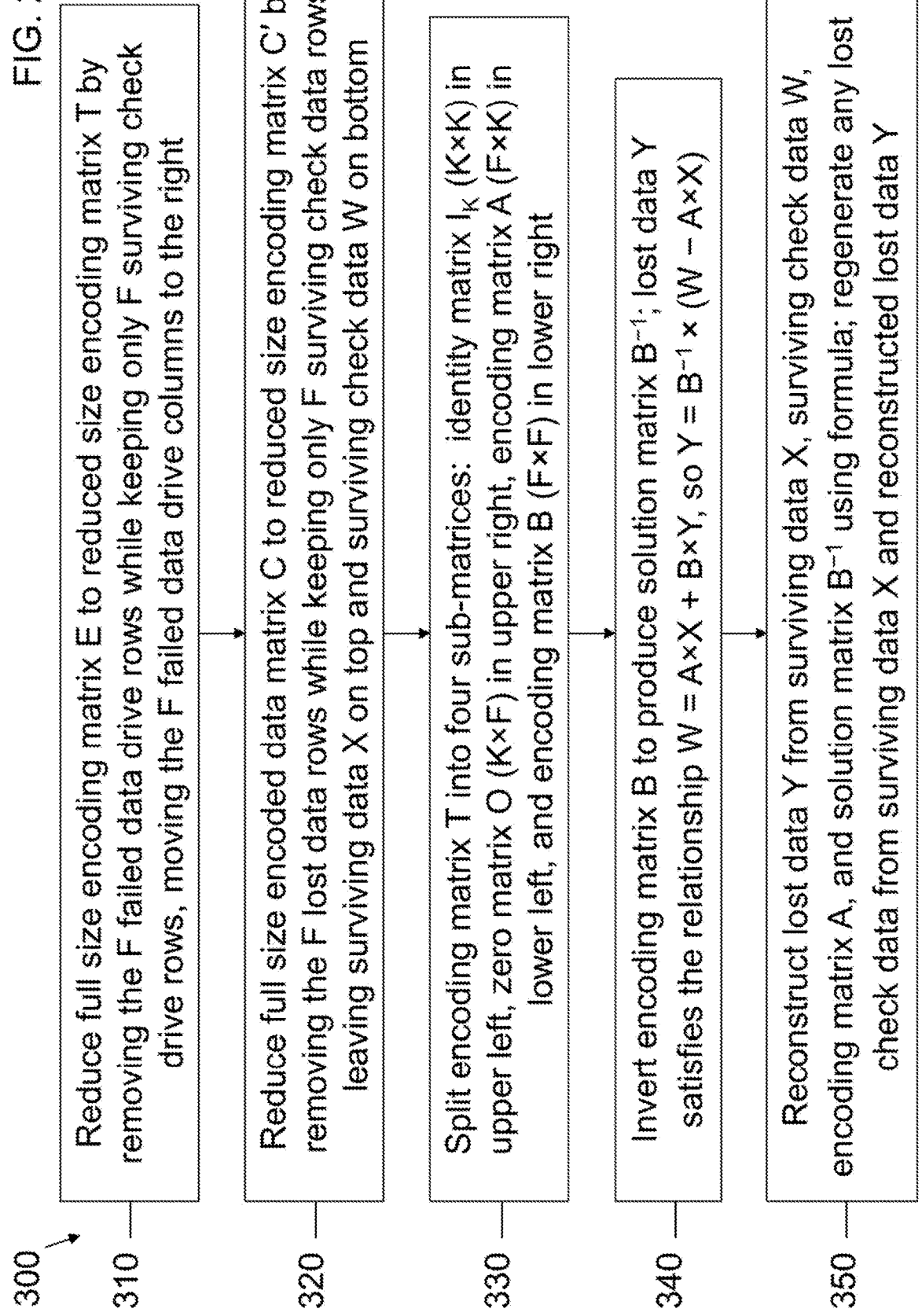

410 — Initialize (one time) – build two lookup tables, one for low-order nibbles, one for high-order nibbles, each one containing 256 entries of the 16 possible products of one nibble and one factor

↓

420 — Prepare (once per operand data) – load next 64 bytes of operand data from memory into four operand registers; the parallel lookup multiplier will leave these registers alone to avoid reloading from memory on succeeding calls

↓

430 — Execute (once per call) – load the 16 possible high-order nibble products from memory for the current factor into one register; repeat for the low-order nibble products into another register; clear four output registers

↓

440 — Execute (once per 32 bytes of data) – move two registers of operand data (bytes) into four registers of scratch data (nibbles)

↓

450 — Multiply (once per 32 bytes of data) – use PSHUFB on the nibble data in the scratch registers, accumulating the corresponding low-order nibble and high-order nibble products in the output registers

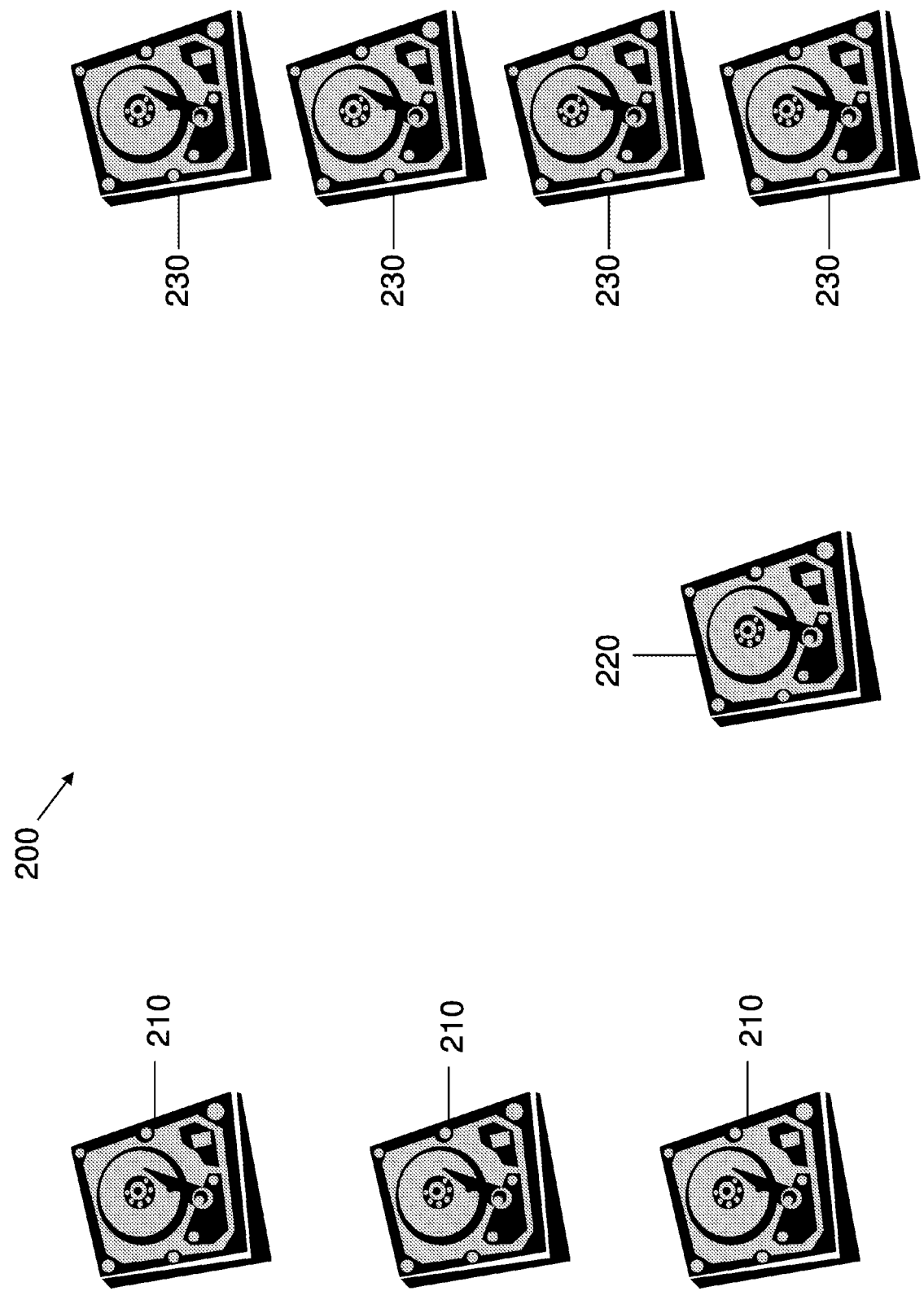

ACCELERATED ERASURE CODING SYSTEM AND METHOD

CROSS-REFERENCE TO RELATED APPLICATIONS

This application is a continuation of U.S. patent application Ser. No. 16/855,910 filed Apr. 22, 2020, which is a continuation of U.S. patent application Ser. No. 16/358,602 filed Mar. 19, 2019, now U.S. Pat. No. 10,666,296, issued on May 26, 2020, which is a continuation of U.S. patent application Ser. No. 15/976,175 filed May 10, 2018, now U.S. Pat. No. 10,291,259, issued May 14, 2019, which is a continuation of U.S. patent application er. No. 15/201,196, filed on Jul. 1, 2016, now U.S. Pat. No. 10,003,358, issued on Jun. 19, 2018, which is a continuation of U.S. patent application Ser. No. 14/852,438, filed on Sep. 11, 2015, now U.S. Pat. No. 9,385,759, issued on Jul. 5, 2016, which is a continuation of U.S. patent application Ser. No. 14/223,740, filed on Mar. 24, 2014, now U.S. Pat. No. 9,160,374, issued on Oct. 13, 2015, which is a continuation of U.S. patent application Ser. No. 13/341,833, filed on Dec. 30, 2011, now U.S. Pat. No. 8,683,296, issued on Mar. 25, 2014, the entire contents of each of which are expressly incorporated herein by reference.

BACKGROUND

Field

Aspects of embodiments of the present invention are directed toward an accelerated erasure coding system and method.

Description of Related Art

An erasure code is a type of error-correcting code (ECC) useful for forward error-correction in applications like a redundant array of independent disks (RAID) or high-speed communication systems. In a typical erasure code, data (or original data) is organized in stripes, each of which is broken up into N equal-sized blocks, or data blocks, for some positive integer N. The data for each stripe is thus reconstructable by putting the N data blocks together. However, to handle situations where one or more of the original N data blocks gets lost, erasure codes also encode an additional M equal-sized blocks (called check blocks or check data) from the original N data blocks, for some positive integer M.

The N data blocks and the M check blocks are all the same size. Accordingly, there are a total of N+M equal-sized blocks after encoding. The N+M blocks may, for example, be transmitted to a receiver as N+M separate packets, or written to N+M corresponding disk drives. For ease of description, all N+M blocks after encoding will be referred to as encoded blocks, though some (for example, N of them) may contain unencoded portions of the original data. That is, the encoded data refers to the original data together with the check data.

The M check blocks build redundancy into the system, in a very efficient manner, in that the original data (as well as any lost check data) can be reconstructed if any N of the N+M encoded blocks are received by the receiver, or if any N of the N+M disk drives are functioning correctly. Note that such an erasure code is also referred to as "optimal." For ease of description, only optimal erasure codes will be discussed in this application. In such a code, up to M of the encoded blocks can be lost, (e.g., up to M of the disk drives can fail) so that if any N of the N+M encoded blocks are received successfully by the receiver, the original data (as well as the check data) can be reconstructed. N/(N+M) is thus the code rate of the erasure code encoding (i.e., how much space the original data takes up in the encoded data). Erasure codes for select values of N and M can be implemented on RAID systems employing N+M (disk) drives by spreading the original data among N "data" drives, and using the remaining M drives as "check" drives. Then, when any N of the N+M drives are correctly functioning, the original data can be reconstructed, and the check data can be regenerated.

Erasure codes (or more specifically, erasure coding systems) are generally regarded as impractical for values of M larger than 1 (e.g., RAIDS systems, such as parity drive systems) or 2 (RAID6 systems), that is, for more than one or two check drives. For example, see H. Peter Anvin, "The mathematics of RAID-6," the entire content of which is incorporated herein by reference, p. 7, "Thus, in 2-disk-degraded mode, performance will be very slow. However, it is expected that that will be a rare occurrence, and that performance will not matter significantly in that case." See also Robert Maddock et al., "Surviving Two Disk Failures," p. 6, "The main difficulty with this technique is that calculating the check codes, and reconstructing data after failures, is quite complex. It involves polynomials and thus multiplication, and requires special hardware, or at least a signal processor, to do it at sufficient speed." In addition, see also James S. Plank, "All About Erasure Codes: — Reed—Solomon Coding—LDPC Coding," slide 15 (describing computational complexity of Reed—Solomon decoding), "Bottom line: When n & m grow, it is brutally expensive." Accordingly, there appears to be a general consensus among experts in the field that erasure coding systems are impractical for RAID systems for all but small values of M (that is, small numbers of check drives), such as 1 or 2.

Modern disk drives, on the other hand, are much less reliable than those envisioned when RAID was proposed. This is due to their capacity growing out of proportion to their reliability. Accordingly, systems with only a single check disk have, for the most part, been discontinued in favor of systems with two check disks.

In terms of reliability, a higher check disk count is clearly more desirable than a lower check disk count. If the count of error events on different drives is larger than the check disk count, data may be lost and that cannot be reconstructed from the correctly functioning drives. Error events extend well beyond the traditional measure of advertised mean time between failures (MTBF). A simple, real world example is a service event on a RAID system where the operator mistakenly replaces the wrong drive or, worse yet, replaces a good drive with a broken drive. In the absence of any generally accepted methodology to train, certify, and measure the effectiveness of service technicians, these types of events occur at an unknown rate, but certainly occur. The foolproof solution for protecting data in the face of multiple error events is to increase the check disk count.

SUMMARY

Aspects of embodiments of the present invention address these problems by providing a practical erasure coding system that, for byte-level RAID processing (where each byte is made up of 8 bits), performs well even for values of N+M as large as 256 drives (for example, N=127 data drives and M=129 check drives). Further aspects provide for a single precomputed encoding matrix (or master encoding matrix) S of size $M_{max} \times N_{max}$, or $(N_{max}+M_{max}) \times N_{max}$ or $(M_{max}-1) \times N_{max}$, elements (e.g., bytes), which can be used, for example, for any combination of $N \leq N_{max}$ data drives and $M < M_{max}$ check drives such that $N_{max}+M_{max} \leq 256$ (e.g., $N_{max}=127$ and $M_{max}=129$, or $N_{max}=63$ and $M_{max}=193$). This is an improvement over prior art solutions that rebuild such matrices from scratch every time N or M changes (such as adding another check drive). Still higher values of N and M are possible with larger processing increments, such as 2 bytes, which affords up to N+M=65,536 drives (such as N=32,767 data drives and M=32,769 check drives).

Higher check disk count can offer increased reliability and decreased cost. The higher reliability comes from factors such as the ability to withstand more drive failures. The decreased cost arises from factors such as the ability to create larger groups of data drives. For example, systems with two checks disks are typically limited to group sizes of 10 or fewer drives for reliability reasons. With a higher check disk count, larger groups are available, which can lead to fewer overall components for the same unit of storage and hence, lower cost.

Additional aspects of embodiments of the present invention further address these problems by providing a standard parity drive as part of the encoding matrix. For instance, aspects provide for a parity drive for configurations with up to 127 data drives and up to 128 (non-parity) check drives, for a total of up to 256 total drives including the parity drive. Further aspects provide for different breakdowns, such as up to 63 data drives, a parity drive, and up to 192 (non-parity) check drives. Providing a parity drive offers performance comparable to RAID5 in comparable circumstances (such as single data drive failures) while also being able to tolerate significantly larger numbers of data drive failures by including additional (non-parity) check drives.

Further aspects are directed to a system and method for implementing a fast solution matrix algorithm for Reed—Solomon codes. While known solution matrix algorithms compute an N×N solution matrix (see, for example, J. S. Plank, "A tutorial on Reed-Solomon coding for fault-tolerance in RAID-like systems," Software—Practice & Experience, 27(9):995-1012, September 1997, and J. S. Plank and Y. Ding, "Note: Correction to the 1997 tutorial on Reed-Solomon coding," Technical Report CS-03-504, University of Tennessee, April 2003), requiring $O(N^3)$ operations, regardless of the number of failed data drives, aspects of embodiments of the present invention compute only an F×F solution matrix, where F is the number of failed data drives. The overhead for computing this F×F solution matrix is approximately $F^3/3$ multiplication operations and the same number of addition operations. Not only is F≤N, in almost any practical application, the number of failed data drives F is considerably smaller than the number of data drives N. Accordingly, the fast solution matrix algorithm is considerably faster than any known approach for practical values of F and N.

Still further aspects are directed toward fast implementations of the check data generation and the lost (original and check) data reconstruction. Some of these aspects are directed toward fetching the surviving (original and check) data a minimum number of times (that is, at most once) to carry out the data reconstruction. Some of these aspects are directed toward efficient implementations that can maximize or significantly leverage the available parallel processing power of multiple cores working concurrently on the check data generation and the lost data reconstruction. Existing implementations do not attempt to accelerate these aspects of the data generation and thus fail to achieve a comparable level of performance.

In an exemplary embodiment of the present invention, a system for accelerated error-correcting code (ECC) processing is provided. The system includes a processing core for executing computer instructions and accessing data from a main memory; and a non-volatile storage medium (for example, a disk drive, or flash memory) for storing the computer instructions. The processing core, the storage medium, and the computer instructions are configured to implement an erasure coding system. The erasure coding system includes a data matrix for holding original data in the main memory, a check matrix for holding check data in the main memory, an encoding matrix for holding first factors in the main memory, and a thread for executing on the processing core. The first factors are for encoding the original data into the check data. The thread includes a parallel multiplier for concurrently multiplying multiple data entries of a matrix by a single factor; and a first sequencer for ordering operations through the data matrix and the encoding matrix using the parallel multiplier to generate the check data.

The first sequencer may be configured to access each entry of the data matrix from the main memory at most once while generating the check data.

The processing core may include a plurality of processing cores. The thread may include a plurality of threads. The erasure coding system may further include a scheduler for generating the check data by dividing the data matrix into a plurality of data matrices, dividing the check matrix into a plurality of check matrices, assigning corresponding ones of the data matrices and the check matrices to the threads, and assigning the threads to the processing cores to concurrently generate portions of the check data corresponding to the check matrices from respective ones of the data matrices.

The data matrix may include a first number of rows. The check matrix may include a second number of rows. The encoding matrix may include the second number of rows and the first number of columns.

The data matrix may be configured to add rows to the first number of rows or the check matrix may be configured to add rows to the second number of rows while the first factors remain unchanged.

Each of entries of one of the rows of the encoding matrix may include a multiplicative identity factor (such as 1).

The data matrix may be configured to be divided by rows into a surviving data matrix for holding surviving original data of the original data, and a lost data matrix corresponding to lost original data of the original data and including a third number of rows.

The erasure coding system may further include a solution matrix for holding second factors in the main memory. The second factors are for decoding the check data into the lost original data using the surviving original data and the first factors.

The solution matrix may include the third number of rows and the third number of columns.

The solution matrix may further include an inverted said third number by said third number sub-matrix of the encoding matrix.

The erasure coding system may further include a first list of rows of the data matrix corresponding to the surviving data matrix, and a second list of rows of the data matrix corresponding to the lost data matrix.

The data matrix may be configured to be divided into a surviving data matrix for holding surviving original data of the original data, and a lost data matrix corresponding to lost original data of the original data. The erasure coding system may further include a solution matrix for holding second factors in the main memory. The second factors are for decoding the check data into the lost original data using the surviving original data and the first factors. The thread may further include a second sequencer for ordering operations through the surviving data matrix, the encoding matrix, the check matrix, and the solution matrix using the parallel multiplier to reconstruct the lost original data.

The second sequencer may be further configured to access each entry of the surviving data matrix from the main memory at most once while reconstructing the lost original data.

The processing core may include a plurality of processing cores. The thread may include a plurality of threads. The erasure coding system may further include: a scheduler for generating the check data and reconstructing the lost original data by dividing the data matrix into a plurality of data matrices; dividing the surviving data matrix into a plurality of surviving data matrices; dividing the lost data matrix into a plurality of lost data matrices; dividing the check matrix into a plurality of check matrices; assigning corresponding ones of the data matrices, the surviving data matrices, the lost data matrices, and the check matrices to the threads; and assigning the threads to the processing cores to concurrently generate portions of the check data corresponding to the check matrices from respective ones of the data matrices and to concurrently reconstruct portions of the lost original data corresponding to the lost data matrices from respective ones of the surviving data matrices and the check matrices.

The check matrix may be configured to be divided into a surviving check matrix for holding surviving check data of the check data, and a lost check matrix corresponding to lost check data of the check data. The second sequencer may be configured to order operations through the surviving data matrix, the reconstructed lost original data, and the encoding matrix using the parallel multiplier to regenerate the lost check data.

The second sequencer may be further configured to reconstruct the lost original data concurrently with regenerating the lost check data.

The second sequencer may be further configured to access each entry of the surviving data matrix from the main memory at most once while reconstructing the lost original data and regenerating the lost check data.

The second sequencer may be further configured to regenerate the lost check data without accessing the reconstructed lost original data from the main memory.

The processing core may include a plurality of processing cores. The thread may include a plurality of threads. The erasure coding system may further include a scheduler for generating the check data, reconstructing the lost original data, and regenerating the lost check data by: dividing the data matrix into a plurality of data matrices; dividing the surviving data matrix into a plurality of surviving data matrices; dividing the lost data matrix into a plurality of lost data matrices; dividing the check matrix into a plurality of check matrices; dividing the surviving check matrix into a plurality of surviving check matrices; dividing the lost check matrix into a plurality of lost check matrices; assigning corresponding ones of the data matrices, the surviving data matrices, the lost data matrices, the check matrices, the surviving check matrices, and the lost check matrices to the threads; and assigning the threads to the processing cores to concurrently generate portions of the check data corresponding to the check matrices from respective ones of the data matrices, to concurrently reconstruct portions of the lost original data corresponding to the lost data matrices from respective ones of the surviving data matrices and the surviving check matrices, and to concurrently regenerate portions of the lost check data corresponding to the lost check matrices from respective ones of the surviving data matrices and respective portions of the reconstructed lost original data.

The processing core may include 16 data registers. Each of the data registers may include 16 bytes. The parallel multiplier may be configured to process the data in units of at least 64 bytes spread over at least four of the data registers at a time.

Consecutive instructions to process each of the units of the data may access separate ones of the data registers to permit concurrent execution of the consecutive instructions by the processing core.

The parallel multiplier may include two lookup tables for doing concurrent multiplication of 4-bit quantities across 16 byte-sized entries using the PSHUFB (Packed Shuffle Bytes) instruction.

The parallel multiplier may be further configured to receive an input operand in four of the data registers, and return with the input operand intact in the four of the data registers.

According to another exemplary embodiment of the present invention, a method of accelerated error-correcting code (ECC) processing on a computing system is provided. The computing system includes a non-volatile storage medium (such as a disk drive or flash memory), a processing core for accessing instructions and data from a main memory, and a computer program including a plurality of computer instructions for implementing an erasure coding system. The method includes: storing the computer program on the storage medium; executing the computer instructions on the processing core; arranging original data as a data matrix in the main memory; arranging first factors as an encoding matrix in the main memory, the first factors being for encoding the original data into check data, the check data being arranged as a check matrix in the main memory; and generating the check data using a parallel multiplier for concurrently multiplying multiple data entries of a matrix by a single factor. The generating of the check data includes ordering operations through the data matrix and the encoding matrix using the parallel multiplier.

The generating of the check data may include accessing each entry of the data matrix from the main memory at most once.

The processing core may include a plurality of processing cores. The executing of the computer instructions may include executing the computer instructions on the processing cores. The method may further include scheduling the generating of the check data by: dividing the data matrix into a plurality of data matrices; dividing the check matrix into a plurality of check matrices; and assigning corresponding ones of the data matrices and the check matrices to the processing cores to concurrently generate portions of the check data corresponding to the check matrices from respective ones of the data matrices.

The method may further include: dividing the data matrix into a surviving data matrix for holding surviving original data of the original data, and a lost data matrix corresponding to lost original data of the original data; arranging second factors as a solution matrix in the main memory, the second factors being for decoding the check data into the lost original data using the surviving original data and the first factors; and reconstructing the lost original data by ordering operations through the surviving data matrix, the encoding matrix, the check matrix, and the solution matrix using the parallel multiplier.

The reconstructing of the lost original data may include accessing each entry of the surviving data matrix from the main memory at most once.

The processing core may include a plurality of processing cores. The executing of the computer instructions may include executing the computer instructions on the processing cores. The method may further include scheduling the generating of the check data and the reconstructing of the lost original data by: dividing the data matrix into a plurality of data matrices; dividing the surviving data matrix into a plurality of surviving data matrices; dividing the lost data matrix into a plurality of lost data matrices; dividing the check matrix into a plurality of check matrices; and assigning corresponding ones of the data matrices, the surviving data matrices, the lost data matrices, and the check matrices to the processing cores to concurrently generate portions of the check data corresponding to the check matrices from respective ones of the data matrices and to concurrently reconstruct portions of the lost original data corresponding to the lost data matrices from respective ones of the surviving data matrices and the check matrices.

The method may further include: dividing the check matrix into a surviving check matrix for holding surviving check data of the check data, and a lost check matrix corresponding to lost check data of the check data; and regenerating the lost check data by ordering operations through the surviving data matrix, the reconstructed lost original data, and the encoding matrix using the parallel multiplier.

The reconstructing of the lost original data may take place concurrently with the regenerating of the lost check data.

The reconstructing of the lost original data and the regenerating of the lost check data may include accessing each entry of the surviving data matrix from the main memory at most once.

The regenerating of the lost check data may take place without accessing the reconstructed lost original data from the main memory.

The processing core may include a plurality of processing cores. The executing of the computer instructions may include executing the computer instructions on the processing cores. The method may further include scheduling the generating of the check data, the reconstructing of the lost original data, and the regenerating of the lost check data by: dividing the data matrix into a plurality of data matrices; dividing the surviving data matrix into a plurality of surviving data matrices; dividing the lost data matrix into a plurality of lost data matrices; dividing the check matrix into a plurality of check matrices; dividing the surviving check matrix into a plurality of surviving check matrices; dividing the lost check matrix into a plurality of lost check matrices; and assigning corresponding ones of the data matrices, the surviving data matrices, the lost data matrices, the check matrices, the surviving check matrices, and the lost check matrices to the processing cores to concurrently generate portions of the check data corresponding to the check matrices from respective ones of the data matrices, to concurrently reconstruct portions of the lost original data corresponding to the lost data matrices from respective ones of the surviving data matrices and the surviving check matrices, and to concurrently regenerate portions of the lost check data corresponding to the lost check matrices from respective ones of the surviving data matrices and respective portions of the reconstructed lost original data.

According to yet another exemplary embodiment of the present invention, a non-transitory computer-readable storage medium (such as a disk drive, a compact disk (CD), a digital video disk (DVD), flash memory, a universal serial bus (USB) drive, etc.) containing a computer program including a plurality of computer instructions for performing accelerated error-correcting code (ECC) processing on a computing system is provided. The computing system includes a processing core for accessing instructions and data from a main memory.

The computer instructions are configured to implement an erasure coding system when executed on the computing system by performing the steps of: arranging original data as a data matrix in the main memory; arranging first factors as an encoding matrix in the main memory, the first factors being for encoding the original data into check data, the check data being arranged as a check matrix in the main memory; and generating the check data using a parallel multiplier for concurrently multiplying multiple data entries of a matrix by a single factor. The generating of the check data includes ordering operations through the data matrix and the encoding matrix using the parallel multiplier.

The generating of the check data may include accessing each entry of the data matrix from the main memory at most once.

The processing core may include a plurality of processing cores. The computer instructions may be further configured to perform the step of scheduling the generating of the check data by: dividing the data matrix into a plurality of data matrices; dividing the check matrix into a plurality of check matrices; and assigning corresponding ones of the data matrices and the check matrices to the processing cores to concurrently generate portions of the check data corresponding to the check matrices from respective ones of the data matrices.

The computer instructions may be further configured to perform the steps of: dividing the data matrix into a surviving data matrix for holding surviving original data of the original data, and a lost data matrix corresponding to lost original data of the original data; arranging second factors as a solution matrix in the main memory, the second factors being for decoding the check data into the lost original data using the surviving original data and the first factors; and reconstructing the lost original data by ordering operations through the surviving data matrix, the encoding matrix, the check matrix, and the solution matrix using the parallel multiplier.

The computer instructions may be further configured to perform the steps of: dividing the check matrix into a surviving check matrix for holding surviving check data of the check data, and a lost check matrix corresponding to lost check data of the check data; and regenerating the lost check data by ordering operations through the surviving data matrix, the reconstructed lost original data, and the encoding matrix using the parallel multiplier.

The reconstructing of the lost original data and the regenerating of the lost check data may include accessing each entry of the surviving data matrix from the main memory at most once.

The processing core may include a plurality of processing cores. The computer instructions may be further configured to perform the step of scheduling the generating of the check data, the reconstructing of the lost original data, and the regenerating of the lost check data by: dividing the data matrix into a plurality of data matrices; dividing the surviving data matrix into a plurality of surviving data matrices; dividing the lost data matrix into a plurality of lost data matrices; dividing the check matrix into a plurality of check matrices; dividing the surviving check matrix into a plurality of surviving check matrices; dividing the lost check matrix into a plurality of lost check matrices; and assigning corresponding ones of the data matrices, the surviving data matrices, the lost data matrices, the check matrices, the surviving check matrices, and the lost check matrices to the processing cores to concurrently generate portions of the check data corresponding to the check matrices from respective ones of the data matrices, to concurrently reconstruct portions of the lost original data corresponding to the lost data matrices from respective ones of the surviving data matrices and the surviving check matrices, and to concurrently regenerate portions of the lost check data corresponding to the lost check matrices from respective ones of the surviving data matrices and respective portions of the reconstructed lost original data.

By providing practical and efficient systems and methods for erasure coding systems (which for byte-level processing can support up to N+M=256 drives, such as N=127 data drives and M=129 check drives, including a parity drive), applications such as RAID systems that can tolerate far more failing drives than was thought to be possible or practical can be implemented with accelerated performance significantly better than any prior art solution.

BRIEF DESCRIPTION OF THE DRAWINGS

The accompanying drawings, together with the specification, illustrate exemplary embodiments of the present invention and, together with the description, serve to explain aspects and principles of the present invention.

FIG. 1 shows an exemplary stripe of original and check data according to an embodiment of the present invention.

FIG. 2 shows an exemplary method for reconstructing lost data after a failure of one or more drives according to an embodiment of the present invention.

FIG. 3 shows an exemplary method for performing a parallel lookup Galois field multiplication according to an embodiment of the present invention.

FIG. 9 shows an exemplary disk drive configuration according to an embodiment of the present invention.

DETAILED DESCRIPTION

Figure 4:
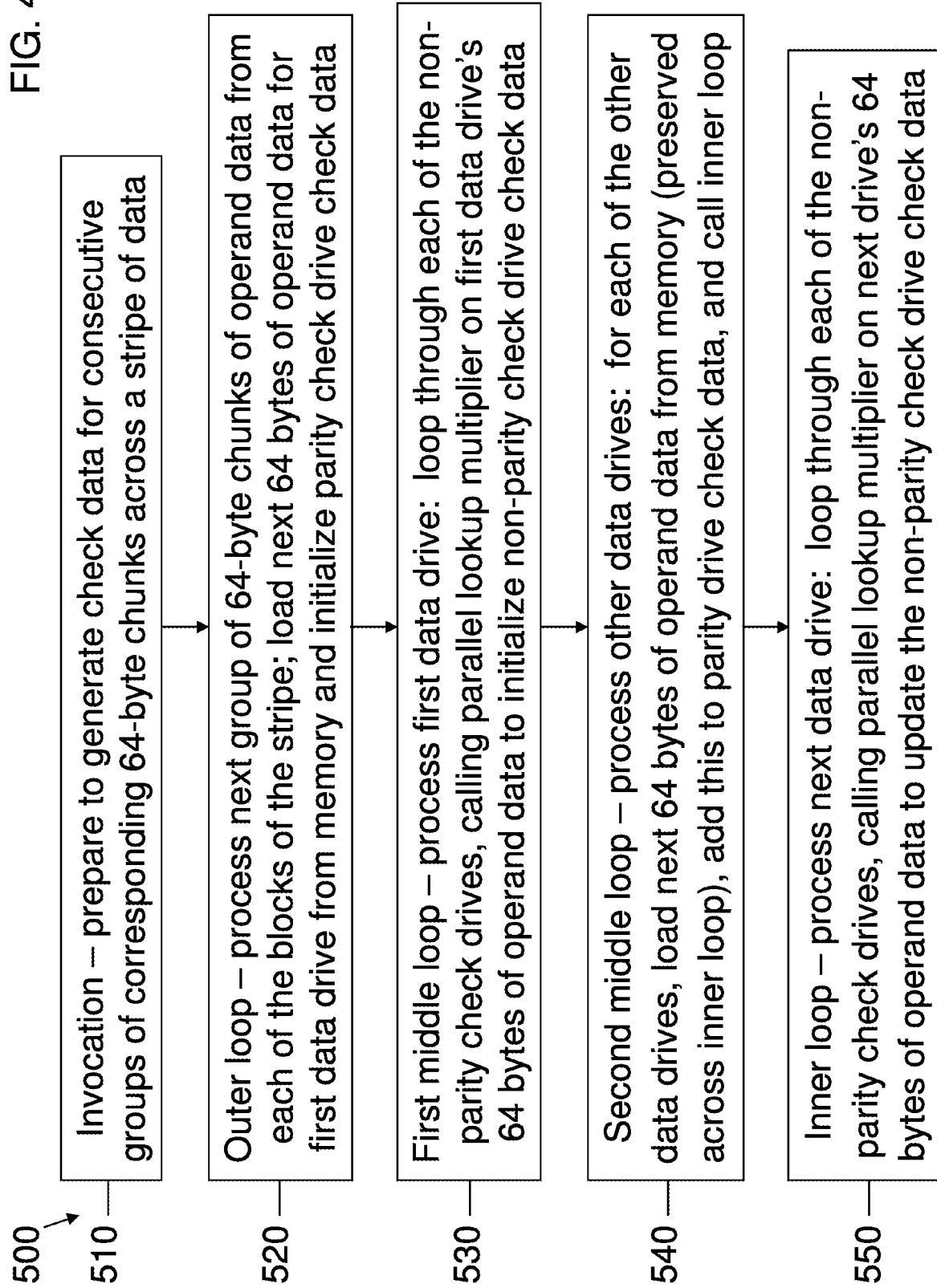
FIG. 4 shows an exemplary method for sequencing the parallel lookup multiplier to perform the check data generation according to an embodiment of the present invention.

Hereinafter, exemplary embodiments of the invention will be described in more detail with reference to the accompanying drawings. In the drawings, like reference numerals refer to like elements throughout.

While optimal erasure codes have many applications, for ease of description, they will be described in this application with respect to RAID applications, i.e., erasure coding systems for the storage and retrieval of digital data distributed across numerous storage devices (or drives), though the present application is not limited thereto. For further ease of description, the storage devices will be assumed to be disk drives, though the invention is not limited thereto. In RAID systems, the data (or original data) is broken up into stripes, each of which includes N uniformly sized blocks (data blocks), and the N blocks are written across N separate drives (the data drives), one block per data drive.

In addition, for ease of description, blocks will be assumed to be composed of L elements, each element having a fixed size, say 8 bits or one byte. An element, such as a byte, forms the fundamental unit of operation for the RAID processing, but the invention is just as applicable to other size elements, such as 16 bits (2 bytes). For simplification, unless otherwise indicated, elements will be assumed to be one byte in size throughout the description that follows, and the term "element(s)" and "byte(s)" will be used synonymously.

Conceptually, different stripes can distribute their data blocks across different combinations of drives, or have different block sizes or numbers of blocks, etc., but for simplification and ease of description and implementation, the described embodiments in the present application assume a consistent block size (L bytes) and distribution of blocks among the data drives between stripes. Further, all variables, such as the number of data drives N, will be assumed to be positive integers unless otherwise specified. In addition, since the N=1 case reduces to simple data mirroring (that is, copying the same data drive multiple times), it will also be assumed for simplicity that N≥2 throughout.

The N data blocks from each stripe are combined using arithmetic operations (to be described in more detail below) in M different ways to produce M blocks of check data (check blocks), and the M check blocks written across M drives (the check drives) separate from the N data drives, one block per check drive. These combinations can take place, for example, when new (or changed) data is written to (or back to) disk. Accordingly, each of the N+M drives (data drives and check drives) stores a similar amount of data, namely one block for each stripe. As the processing of multiple stripes is conceptually similar to the processing of one stripe (only processing multiple blocks per drive instead of one), it will be further assumed for simplification that the data being stored or retrieved is only one stripe in size unless otherwise indicated. It will also be assumed that the block size L is sufficiently large that the data can be consistently divided across each block to produce subsets of the data that include respective portions of the blocks (for efficient concurrent processing by different processing units).

FIG. 1 shows an exemplary stripe 10 of original and check data according to an embodiment of the present invention.

Referring to FIG. 1, the stripe 10 can be thought of not only as the original N data blocks 20 that make up the original data, but also the corresponding M check blocks 30 generated from the original data (that is, the stripe 10 represents encoded data). Each of the N data blocks 20 is composed of L bytes 25 (labeled byte 1, byte 2, . . . , byte L), and each of the M check blocks 30 is composed of L bytes 35 (labeled similarly). In addition, check drive 1, byte 1, is a linear combination of data drive 1, byte 1; data drive 2, byte 1; . . . ; data drive N, byte 1. Likewise, check drive 1, byte 2, is generated from the same linear combination formula as check drive 1, byte 1, only using data drive 1, byte 2; data drive 2, byte 2; . . . ; data drive N, byte 2. In contrast, check drive 2, byte 1, uses a different linear combination formula than check drive 1, byte 1, but applies it to the same data, namely data drive 1, byte 1; data drive 2, byte 1; . . . ; data drive N, byte 1. In this fashion, each of the other check bytes 35 is a linear combination of the respective bytes of each of the N data drives 20 and using the corresponding linear combination formula for the particular check drive 30.

The stripe 10 in FIG. 1 can also be represented as a matrix C of encoded data. C has two sub-matrices, namely original data D on top and check data J on bottom. That is, $$C = \begin{bmatrix} D \\ J \end{bmatrix} = \begin{bmatrix} D_{11} & D_{12} & \cdots & D_{1L} \\ D_{21} & D_{22} & \cdots & D_{2L} \\ \vdots & \vdots & \ddots & \vdots \\ D_{N1} & D_{N2} & \cdots & D_{NL} \\ J_{11} & J_{12} & \cdots & J_{1L} \\ J_{21} & J_{22} & \cdots & J_{2L} \\ \vdots & \vdots & \ddots & \vdots \\ J_{M1} & J_{M2} & \cdots & J_{ML} \end{bmatrix},$$

where $D_{ij}$=byte j from data drive i and $J_{ij}$=byte j from check drive i. Thus, the rows of encoded data C represent blocks, while the columns represent corresponding bytes of each of the drives.

Further, in case of a disk drive failure of one or more disks, the arithmetic operations are designed in such a fashion that for any stripe, the original data (and by extension, the check data) can be reconstructed from any combination of N data and check blocks from the corresponding N+M data and check blocks that comprise the stripe. Thus, RAID provides both parallel processing (reading and writing the data in stripes across multiple drives concurrently) and fault tolerance (regeneration of the original data even if as many as M of the drives fail), at the computational cost of generating the check data any time new data is written to disk, or changed data is written back to disk, as well as the computational cost of reconstructing any lost original data and regenerating any lost check data after a disk failure.

For example, for M=1 check drive, a single parity drive can function as the check drive (i.e., a RAID4 system). Here, the arithmetic operation is bitwise exclusive OR of each of the N corresponding data bytes in each data block of the stripe. In addition, as mentioned earlier, the assignment of parity blocks from different stripes to the same drive (i.e., RAID4) or different drives (i.e., RAID5) is arbitrary, but it does simplify the description and implementation to use a consistent assignment between stripes, so that will be assumed throughout. Since M=1 reduces to the case of a single parity drive, it will further be assumed for simplicity that M≥2 throughout.

For such larger values of M, Galois field arithmetic is used to manipulate the data, as described in more detail later. Galois field arithmetic, for Galois fields of powers-of-2 (such as $2^P$) numbers of elements, includes two fundamental operations: (1) addition (which is just bitwise exclusive OR, as with the parity drive-only operations for M=1), and (2) multiplication. While Galois field (GF) addition is trivial on standard processors, GF multiplication is not. Accordingly, a significant component of RAID performance for M≥2 is speeding up the performance of GF multiplication, as will be discussed later. For purposes of description, GF addition will be represented by the symbol+throughout while GF multiplication will be represented by the symbol×throughout.

Briefly, in exemplary embodiments of the present invention, each of the M check drives holds linear combinations (over GF arithmetic) of the N data drives of original data, one linear combination (i.e., a GF sum of N terms, where each term represents a byte of original data times a corresponding factor (using GF multiplication) for the respective data drive) for each check drive, as applied to respective bytes in each block. One such linear combination can be a simple parity, i.e., entirely GF addition (all factors equal 1), such as a GF sum of the first byte in each block of original data as described above.

The remaining M−1 linear combinations include more involved calculations that include the nontrivial GF multiplication operations (e.g., performing a GF multiplication of the first byte in each block by a corresponding factor for the respective data drive, and then performing a GF sum of all these products). These linear combinations can be represented by an (N+M)×N matrix (encoding matrix or information dispersal matrix (IDM)) E of the different factors, one factor for each combination of (data or check) drive and data drive, with one row for each of the N+M data and check drives and one column for each of the N data drives. The IDM E can also be represented as $$\begin{bmatrix} I_N \\ H \end{bmatrix},$$

where $I_N$ represents the N×N identity matrix (i.e., the original (unencoded) data) and H represents the M×N matrix of factors for the check drives (where each of the M rows corresponds to one of the M check drives and each of the N columns corresponds to one of the N data drives).

Thus, $$E = \begin{bmatrix} I_N \\ H \end{bmatrix} = \begin{bmatrix} 1 & 0 & \cdots & 0 \\ 0 & 1 & \cdots & 0 \\ \vdots & \vdots & \ddots & \vdots \\ 0 & 0 & \cdots & 1 \\ H_{11} & H_{12} & \cdots & H_{1N} \\ H_{21} & H_{22} & \cdots & H_{2N} \\ \vdots & \vdots & \ddots & \vdots \\ H_{M1} & H_{M2} & \cdots & H_{MN} \end{bmatrix},$$

where $H_{ij}$=factor for check drive i and data drive j. Thus, the rows of encoded data C represent blocks, while the columns represent corresponding bytes of each of the drives. In addition, check factors H, original data D, and check data J are related by the formula J=H×D (that is, matrix multiplication), or $$\begin{bmatrix} J_{11} & J_{12} & \cdots & J_{1L} \\ J_{21} & J_{22} & \cdots & J_{2L} \\ \vdots & \vdots & \ddots & \vdots \\ J_{M1} & J_{M2} & \cdots & J_{ML} \end{bmatrix} = \begin{bmatrix} H_{11} & H_{12} & \cdots & H_{1N} \\ H_{21} & H_{22} & \cdots & H_{2N} \\ \vdots & \vdots & \ddots & \vdots \\ H_{M1} & H_{M2} & \cdots & H_{ML} \end{bmatrix} \times \begin{bmatrix} D_{11} & D_{12} & \cdots & D_{1L} \\ D_{21} & D_{22} & \cdots & D_{2L} \\ \vdots & \vdots & \ddots & \vdots \\ D_{N1} & D_{N2} & \cdots & D_{NL} \end{bmatrix},$$

where $J_{11}=(H_{11}\times D_{11})+(H_{12}\times D_{21})+ \ldots +(H_{1N}\times D_{N1})$, $J_{12}=(H_{11}\times D_{12})+(H_{12}\times D_{22})+ \ldots +(H_{1N}\times D_{N2})$, $J_{21}=(H_{21}\times D_{11})+(H_{22}\times D_{21}) \ldots (H_{2N}\times D_{N1})$, and in general, $J_{ij}=(H_{i1}\times D_{1j})+(H_{i2}\times D_{2j})+ \ldots +(H_{iN}\times D_{Nj})$ for 1≤i≤M and 1≤j≤L.

Such an encoding matrix E is also referred to as an information dispersal matrix (IDM). It should be noted that matrices such as check drive encoding matrix H and identity matrix $I_N$ also represent encoding matrices, in that they represent matrices of factors to produce linear combinations over GF arithmetic of the original data. In practice, the identity matrix $I_N$ is trivial and may not need to be constructed as part of the IDM E. Only the encoding matrix E, however, will be referred to as the IDM. Methods of building an encoding matrix such as IDM E or check drive encoding matrix H are discussed below. In further embodiments of the present invention (as discussed further in Appendix A), such (N+M)×N (or M×N) matrices can be trivially constructed (or simply indexed) from a master encoding matrix S, which is composed of $(N_{max}+M_{max})\times N_{max}$ (or $M_{max}\times N_{max}$) bytes or elements, where $N_{max}+M_{max}=256$ (or some other power of two) and $N\leq N_{max}$ and $M\leq M_{max}$. For example, one such master encoding matrix S can include a 127×127 element identity matrix on top (for up to $N_{max}=127$ data drives), a row of 1's (for a parity drive), and a 128×127 element encoding matrix on bottom (for up to $M_{max}=129$ check drives, including the parity drive), for a total of $N_{max}+M_{max}=256$ drives.

The original data, in turn, can be represented by an N×L matrix D of bytes, each of the N rows representing the L bytes of a block of the corresponding one of the N data drives. If C represents the corresponding (N+M)×L matrix of encoded bytes (where each of the N+M rows corresponds to one of the N+M data and check drives), then C can be represented as $$E\times D = \begin{bmatrix} I_N \\ H \end{bmatrix} \times D = \begin{bmatrix} I_N \times D \\ H \times D \end{bmatrix} = \begin{bmatrix} D \\ J \end{bmatrix},$$

where J=H×D is an M×L matrix of check data, with each of the M rows representing the L check bytes of the corresponding one of the M check drives. It should be noted that in the relationships such as C=E×D or J=H×D, × represents matrix multiplication over the Galois field (i.e., GF multiplication and GF addition being used to generate each of the entries in, for example, C or J).

In exemplary embodiments of the present invention, the first row of the check drive encoding matrix H (or the $(N+1)^{th}$ row of the IDM E) can be all 1's, representing the parity drive. For linear combinations involving this row, the GF multiplication can be bypassed and replaced with a GF sum of the corresponding bytes since the products are all trivial products involving the identity element 1. Accordingly, in parity drive implementations, the check drive encoding matrix H can also be thought of as an (M−1)×N matrix of non-trivial factors (that is, factors intended to be used in GF multiplication and not just GF addition).

Much of the RAID processing involves generating the check data when new or changed data is written to (or back to) disk. The other significant event for RAID processing is when one or more of the drives fail (data or check drives), or for whatever reason become unavailable. Assume that in such a failure scenario, F data drives fail and G check drives fail, where F and G are nonnegative integers. If F=0, then only check drives failed and all of the original data D survived. In this case, the lost check data can be regenerated from the original data D.

Accordingly, assume at least one data drive fails, that is, F≥1, and let K=N−F represent the number of data drives that survive. K is also a nonnegative integer. In addition, let X represent the surviving original data and Y represent the lost original data. That is, X is a K×L matrix composed of the K rows of the original data matrix D corresponding to the K surviving data drives, while Y is an F×L matrix composed of the F rows of the original data matrix D corresponding to the F failed data drives.

$$\begin{bmatrix} X \\ Y \end{bmatrix}$$

thus represents a permuted original data matrix D (that is, the original data matrix D, only with the surviving original data X on top and the lost original data Y on bottom. It should be noted that once the lost original data Y is reconstructed, it can be combined with the surviving original data X to restore the original data D, from which the check data for any of the failed check drives can be regenerated.

It should also be noted that M−G check drives survive. In order to reconstruct the lost original data Y, enough (that is, at least N) total drives must survive. Given that K=N − F data drives survive, and that M−G check drives survive, it follows that (N−F)+(M−G)≥N must be true to reconstruct the lost original data Y. This is equivalent to F+G≤M (i.e., no more than F+G drives fail), or F≤M−G (that is, the number of failed data drives does not exceed the number of surviving check drives). It will therefore be assumed for simplicity that F ≤M−G.

In the routines that follow, performance can be enhanced by prebuilding lists of the failed and surviving data and check drives (that is, four separate lists). This allows processing of the different sets of surviving and failed drives to be done more efficiently than existing solutions, which use, for example, bit vectors that have to be examined one bit at a time and often include large numbers of consecutive zeros (or ones) when ones (or zeros) are the bit values of interest.

FIG. 2 shows an exemplary method 300 for reconstructing lost data after a failure of one or more drives according to an embodiment of the present invention.

While the recovery process is described in more detail later, briefly it consists of two parts: (1) determining the solution matrix, and (2) reconstructing the lost data from the surviving data. Determining the solution matrix can be done in three steps with the following algorithm (Algorithm 1), with reference to FIG. 2:

1. (Step 310 in FIG. 2) Reducing the (M+N)×N IDM E to an N×N reduced encoding matrix T (also referred to as the transformed IDM) including the K surviving data drive rows and any F of the M−G surviving check drive rows (for instance, the first F surviving check drive rows, as these will include the parity drive if it survived; recall that F≤M−G was assumed). In addition, the columns of the reduced encoding matrix T are rearranged so that the K columns corresponding to the K surviving data drives are on the left side of the matrix and the F columns corresponding to the F failed drives are on the right side of the matrix. (Step 320) These F surviving check drives selected to rebuild the lost original data Y will henceforth be referred to as "the F surviving check drives," and their check data W will be referred to as "the surviving check data," even though M−G check drives survived. It should be noted that W is an F×L matrix composed of the F rows of the check data J corresponding to the F surviving check drives. Further, the surviving encoded data can be represented as a sub-matrix C' of the encoded data C. The surviving encoded data C' is an N×L matrix composed of the surviving original data X on top and the surviving check data W on bottom, that is, $$C' = \begin{bmatrix} X \\ W \end{bmatrix}.$$

2. (Step 330) Splitting the reduced encoding matrix T into four sub-matrices (that are also encoding matrices): (i) a K×K identity matrix IK (corresponding to the K surviving data drives) in the upper left, (ii) a K×F matrix O of zeros in the upper right, (iii) an F×K encoding matrix A in the lower left corresponding to the F surviving check drive rows and the K surviving data drive columns, and (iv) an F×F encoding matrix B in the lower right corresponding to the F surviving check drive rows and the F failed data drive columns. Thus, the reduced encoding matrix T can be represented as $$\begin{bmatrix} I_K & O \\ A & B \end{bmatrix}.$$

3. (Step 340) Calculating the inverse $B^{-1}$ of the F×F encoding matrix B. As is shown in more detail in Appendix A, C'=T×D, or $$\begin{bmatrix} X \\ W \end{bmatrix} = \begin{bmatrix} I_K & O \\ A & B \end{bmatrix} \times \begin{bmatrix} X \\ Y \end{bmatrix},$$

which is mathematically equivalent to W=A×X+B×Y. $B^{-1}$ is the solution matrix, and is itself an F×F encoding matrix. Calculating the solution matrix $B^{-1}$ thus allows the lost original data Y to be reconstructed from the encoding matrices A and B along with the surviving original data X and the surviving check data W.

The F×K encoding matrix A represents the original encoding matrix E, only limited to the K surviving data drives and the F surviving check drives. That is, each of the F rows of A represents a different one of the F surviving check drives, while each of the K columns of A represents a different one of the K surviving data drives. Thus, A provides the encoding factors needed to encode the original data for the surviving check drives, but only applied to the surviving data drives (that is, the surviving partial check data). Since the surviving original data X is available, A can be used to generate this surviving partial check data.

In similar fashion, the F×F encoding matrix B represents the original encoding matrix E, only limited to the F surviving check drives and the F failed data drives. That is, the F rows of B correspond to the same F rows of A, while each of the F columns of B represents a different one of the F failed data drives. Thus, B provides the encoding factors needed to encode the original data for the surviving check drives, but only applied to the failed data drives (that is, the lost partial check data). Since the lost original data Y is not available, B cannot be used to generate any of the lost partial check data. However, this lost partial check data can be determined from A and the surviving check data W. Since this lost partial check data represents the result of applying B to the lost original data Y, $B^{-1}$ thus represents the necessary factors to reconstruct the lost original data Y from the lost partial check data.

It should be noted that steps 1 and 2 in Algorithm 1 above are logical, in that encoding matrices A and B (or the reduced encoding matrix T, for that matter) do not have to actually be constructed. Appropriate indexing of the IDM E (or the master encoding matrix 5) can be used to obtain any of their entries. Step 3, however, is a matrix inversion over GF arithmetic and takes $O(F^3)$ operations, as discussed in more detail later. Nonetheless, this is a significant improvement over existing solutions, which require $O(N^3)$ operations, since the number of failed data drives F is usually significantly less than the number of data drives N in any practical situation.

(Step 350 in FIG. 2) Once the encoding matrix A and the solution matrix $B^{-1}$ are known, reconstructing the lost data from the surviving data (that is, the surviving original data X and the surviving check data W) can be accomplished in four steps using the following algorithm (Algorithm 2):

1. Use A and the surviving original data X (using matrix multiplication) to generate the surviving check data (i.e., A×X), only limited to the K surviving data drives. Call this limited check data the surviving partial check data.
2. Subtract this surviving partial check data from the surviving check data W (using matrix subtraction, i.e., W−A×X, which is just entry-by-entry GF subtraction, which is the same as GF addition for this Galois field). This generates the surviving check data, only this time limited to the F failed data drives. Call this limited check data the lost partial check data.
3. Use the solution matrix $B^{-1}$ and the lost partial check data (using matrix multiplication, i.e., $B^{-1}$×(W−A×X) to reconstruct the lost original data Y. Call this the recovered original data Y.
4. Use the corresponding rows of the IDM E (or master encoding matrix 5) for each of the G failed check drives along with the original data D, as reconstructed from the surviving and recovered original data X and Y, to regenerate the lost check data (using matrix multiplication).

As will be shown in more detail later, steps 1-3 together require O(F) operations times the amount of original data D to reconstruct the lost original data Y for the F failed data drives (i.e., roughly 1 operation per failed data drive per byte of original data D), which is proportionally equivalent to the 0(M) operations times the amount of original data D needed to generate the check data J for the M check drives (i.e., roughly 1 operation per check drive per byte of original data D). In addition, this same equivalence extends to step 4, which takes O(G) operations times the amount of original data D needed to regenerate the lost check data for the G failed check drives (i.e., roughly 1 operation per failed check drive per byte of original data D). In summary, the number of operations needed to reconstruct the lost data is O(F+G) times the amount of original data D (i.e., roughly 1 operation per failed drive (data or check) per byte of original data D). Since F+G<M, this means that the computational complexity of Algorithm 2 (reconstructing the lost data from the surviving data) is no more than that of generating the check data J from the original data D.

As mentioned above, for exemplary purposes and ease of description, data is assumed to be organized in 8-bit bytes, each byte capable of taking on $2^8$=256 possible values. Such data can be manipulated in byte-size elements using GF arithmetic for a Galois field of size $2^8$=256 elements. It should also be noted that the same mathematical principles apply to any power-of-two $2^P$ number of elements, not just 256, as Galois fields can be constructed for any integral power of a prime number. Since Galois fields are finite, and since GF operations never overflow, all results are the same size as the inputs, for example, 8 bits.

In a Galois field of a power-of-two number of elements, addition and subtraction are the same operation, namely a bitwise exclusive OR (XOR) of the two operands. This is a very fast operation to perform on any current processor. It can also be performed on multiple bytes concurrently. Since the addition and subtraction operations take place, for example, on a byte-level basis, they can be done in parallel by using, for instance, x86 architecture Streaming SIMD Extensions (SSE) instructions (SIMD stands for single instruction, multiple data, and refers to performing the same instruction on different pieces of data, possibly concurrently), such as PXOR (Packed (bitwise) Exclusive OR).

SSE instructions can process, for example, 16-byte registers (XMM registers), and are able to process such registers as though they contain 16 separate one-byte operands (or 8 separate two-byte operands, or four separate four-byte operands, etc.) Accordingly, SSE instructions can do byte-level processing 16 times faster than when compared to processing a byte at a time. Further, there are 16 XMM registers, so dedicating four such registers for operand storage allows the data to be processed in 64-byte increments, using the other 12 registers for temporary storage. That is, individual operations can be performed as four consecutive SSE operations on the four respective registers (64 bytes), which can often allow such instructions to be efficiently pipelined and/or concurrently executed by the processor. In addition, the SSE instructions allows the same processing to be performed on different such 64-byte increments of data in parallel using different cores. Thus, using four separate cores can potentially speed up this processing by an additional factor of 4 over using a single core.

For example, a parallel adder (Parallel Adder) can be built using the 16-byte XMM registers and four consecutive PXOR instructions. Such parallel processing (that is, 64 bytes at a time with only a few machine-level instructions) for GF arithmetic is a significant improvement over doing the addition one byte at a time. Since the data is organized in blocks of any fixed number of bytes, such as 4096 bytes (4 kilobytes, or 4 KB) or 32,768 bytes (32 KB), a block can be composed of numerous such 64-byte chunks (e.g., 64 separate 64-byte chunks in 4 KB, or 512 chunks in 32 KB).

Multiplication in a Galois field is not as straightforward. While much of it is bitwise shifts and exclusive OR's (i.e., "additions") that are very fast operations, the numbers "wrap" in peculiar ways when they are shifted outside of their normal bounds (because the field has only a finite set of elements), which can slow down the calculations. This "wrapping" in the GF multiplication can be addressed in many ways. For example, the multiplication can be implemented serially (Serial Multiplier) as a loop iterating over the bits of one operand while performing the shifts, adds, and wraps on the other operand. Such processing, however, takes several machine instructions per bit for 8 separate bits. In other words, this technique requires dozens of machine instructions per byte being multiplied. This is inefficient compared to, for example, the performance of the Parallel Adder described above.

For another approach (Serial Lookup Multiplier), multiplication tables (of all the possible products, or at least all the non-trivial products) can be pre-computed and built ahead of time. For example, a table of 256×256=65,536 bytes can hold all the possible products of the two different one-byte operands). However, such tables can force serialized access on what are only byte-level operations, and not take advantage of wide (concurrent) data paths available on modern processors, such as those used to implement the Parallel Adder above.

In still another approach (Parallel Multiplier), the GF multiplication can be done on multiple bytes at a time, since the same factor in the encoding matrix is multiplied with every element in a data block. Thus, the same factor can be multiplied with 64 consecutive data block bytes at a time. This is similar to the Parallel Adder described above, only there are several more operations needed to perform the operation. While this can be implemented as a loop on each bit of the factor, as described above, only performing the shifts, adds, and wraps on 64 bytes at a time, it can be more efficient to process the 256 possible factors as a (C language) switch statement, with inline code for each of 256 different combinations of two primitive GF operations: Multiply-by-2 and Add. For example, GF multiplication by the factor 3 can be effected by first doing a Multiply-by-2 followed by an Add. Likewise, GF multiplication by 4 is just a Multiply-by-2 followed by a Multiply-by-2 while multiplication by 6 is a Multiply-by-2 followed by an Add and then by another Multiply-by-2.

While this Add is identical to the Parallel Adder described above (e.g., four consecutive PXOR instructions to process 64 separate bytes), Multiply-by-2 is not as straightforward. For example, Multiply-by-2 in GF arithmetic can be implemented across 64 bytes at a time in 4 XMM registers via 4 consecutive PXOR instructions, 4 consecutive PCMPGTB (Packed Compare for Greater Than) instructions, 4 consecutive PADDB (Packed Add) instructions, 4 consecutive PAND (Bitwise AND) instructions, and 4 consecutive PXOR instructions. Though this takes 20 machine instructions, the instructions are very fast and results in 64 consecutive bytes of data at a time being multiplied by 2.

For 64 bytes of data, assuming a random factor between 0 and 255, the total overhead for the Parallel Multiplier is about 6 calls to multiply-by-2 and about 3.5 calls to add, or about 6×20+3.5×4=134 machine instructions, or a little over 2 machine instructions per byte of data. While this compares favorably with byte-level processing, it is still possible to improve on this by building a parallel multiplier with a table lookup (Parallel Lookup Multiplier) using the PSHUFB (Packed Shuffle Bytes) instruction and doing the GF multiplication in 4-bit nibbles (half bytes).

FIG. 3 shows an exemplary method 400 for performing a parallel lookup Galois field multiplication according to an embodiment of the present invention.

Referring to FIG. 3, in step 410, two lookup tables are built once: one lookup table for the low-order nibbles in each byte, and one lookup table for the high-order nibbles in each byte. Each lookup table contains 256 sets (one for each possible factor) of the 16 possible GF products of that factor and the 16 possible nibble values. Each lookup table is thus 256×16=4096 bytes, which is considerably smaller than the 65,536 bytes needed to store a complete one-byte multiplication table. In addition, PSHUFB does 16 separate table lookups at once, each for one nibble, so 8 PSHUFB instructions can be used to do all the table lookups for 64 bytes (128 nibbles).

Next, in step 420, the Parallel Lookup Multiplier is initialized for the next set of 64 bytes of operand data (such as original data or surviving original data). In order to save loading this data from memory on succeeding calls, the Parallel Lookup Multiplier dedicates four registers for this data, which are left intact upon exit of the Parallel Lookup Multiplier. This allows the same data to be called with different factors (such as processing the same data for another check drive).

Next in step 430, to process these 64 bytes of operand data, the Parallel Lookup Multiplier can be implemented with 2 MOVDQA (Move Double Quadword Aligned) instructions (from memory) to do the two table lookups and 4 MOVDQA instructions (register to register) to initialize registers (such as the output registers). These are followed in steps 440 and 450 by two nearly identical sets of 17 register-to-register instructions to carry out the multiplication 32 bytes at a time. Each such set starts (in step 440) with 5 more MOVDQA instructions for further initialization, followed by 2 PSRLW (Packed Shift Right Logical Word) instructions to realign the high-order nibbles for PSHUFB, and 4 PAND instructions to clear the high-order nibbles for PSHUFB. That is, two registers of byte operands are converted into four registers of nibble operands. Then, in step 450, 4 PSHUFB instructions are used to do the parallel table lookups, and 2 PXOR instructions to add the results of the multiplication on the two nibbles to the output registers.

Thus, the Parallel Lookup Multiplier uses 40 machine instructions to perform the parallel multiplication on 64 separate bytes, which is considerably better than the average 134 instructions for the Parallel Multiplier above, and only 10 times as many instructions as needed for the Parallel Adder. While some of the Parallel Lookup Multiplier's instructions are more complex than those of the Parallel Adder, much of this complexity can be concealed through the pipelined and/or concurrent execution of numerous such contiguous instructions (accessing different registers) on modern pipelined processors. For example, in exemplary implementations, the Parallel Lookup Multiplier has been timed at about 15 CPU clock cycles per 64 bytes processed per CPU core (about 0.36 clock cycles per instruction). In addition, the code footprint is practically nonexistent for the Parallel Lookup Multiplier (40 instructions) compared to that of the Parallel Multiplier (about 34,300 instructions), even when factoring the 8 KB needed for the two lookup tables in the Parallel Lookup Multiplier.

In addition, embodiments of the Parallel Lookup Multiplier can be passed 64 bytes of operand data (such as the next 64 bytes of surviving original data X to be processed) in four consecutive registers, whose contents can be preserved upon exiting the Parallel Lookup Multiplier (and all in the same 40 machine instructions) such that the Parallel Lookup Multiplier can be invoked again on the same 64 bytes of data without having to access main memory to reload the data. Through such a protocol, memory accesses can be minimized (or significantly reduced) for accessing the original data D during check data generation or the surviving original data X during lost data reconstruction.

Further embodiments of the present invention are directed towards sequencing this parallel multiplication (and other GF) operations. While the Parallel Lookup Multiplier processes a GF multiplication of 64 bytes of contiguous data times a specified factor, the calls to the Parallel Lookup Multiplier should be appropriately sequenced to provide efficient processing. One such sequencer (Sequencer 1), for example, can generate the check data J from the original data D, and is described further with respect to FIG. 4.

The parity drive does not need GF multiplication. The check data for the parity drive can be obtained, for example, by adding corresponding 64-byte chunks for each of the data drives to perform the parity operation. The Parallel Adder can do this using 4 instructions for every 64 bytes of data for each of the N data drives, or N/16 instructions per byte.

The M−1 non-parity check drives can invoke the Parallel Lookup Multiplier on each 64-byte chunk, using the appropriate factor for the particular combination of data drive and check drive. One consideration is how to handle the data access. Two possible ways are:

1) "column-by-column," i.e., 64 bytes for one data drive, followed by the next 64 bytes for that data drive, etc., and adding the products to the running total in memory (using the Parallel Adder) before moving onto the next row (data drive); and 2) "row-by-row," i.e., 64 bytes for one data drive, followed by the corresponding 64 bytes for the next data drive, etc., and keeping a running total using the Parallel Adder, then moving onto the next set of 64-byte chunks.

Column-by-column can be thought of as "constant factor, varying data," in that the (GF multiplication) factor usually remains the same between iterations while the (64-byte) data changes with each iteration. Conversely, row-by-row can be thought of as "constant data, varying factor," in that the data usually remains the same between iterations while the factor changes with each iteration.

Another consideration is how to handle the check drives. Two possible ways are:

a) one at a time, i.e., generate all the check data for one check drive before moving onto the next check drive; and b) all at once, i.e., for each 64-byte chunk of original data, do all of the processing for each of the check drives before moving onto the next chunk of original data. While each of these techniques performs the same basic operations (e.g., 40 instructions for every 64 bytes of data for each of the N data drives and M−1 non-parity check drives, or 5N(M−1)18 instructions per byte for the Parallel Lookup Multiplier), empirical results show that combination (2)(b), that is, row-by-row data access on all of the check drives between data accesses performs best with the Parallel Lookup Multiplier. One reason may be that such an approach appears to minimize the number of memory accesses (namely, one) to each chunk of the original data D to generate the check data J. This embodiment of Sequencer 1 is described in more detail with reference to FIG. 4.

FIG. 4 shows an exemplary method 500 for sequencing the Parallel Lookup Multiplier to perform the check data generation according to an embodiment of the present invention.

Referring to FIG. 4, in step 510, the Sequencer 1 is called. Sequencer 1 is called to process multiple 64-byte chunks of data for each of the blocks across a stripe of data. For instance, Sequencer 1 could be called to process 512 bytes from each block. If, for example, the block size L is 4096 bytes, then it would take eight such calls to Sequencer 1 to process the entire stripe. The other such seven calls to Sequencer 1 could be to different processing cores, for instance, to carry out the check data generation in parallel. The number of 64-byte chunks to process at a time could depend on factors such as cache dimensions, input/output data structure sizes, etc.

In step 520, the outer loop processes the next 64-byte chunk of data for each of the drives. In order to minimize the number of accesses of each data drive's 64-byte chunk of data from memory, the data is loaded only once and preserved across calls to the Parallel Lookup Multiplier. The first data drive is handled specially since the check data has to be initialized for each check drive. Using the first data drive to initialize the check data saves doing the initialization as a separate step followed by updating it with the first data drive's data. In addition to the first data drive, the first check drive is also handled specially since it is a parity drive, so its check data can be initialized to the first data drive's data directly without needing the Parallel Lookup Multiplier.

In step 530, the first middle loop is called, in which the remainder of the check drives (that is, the non-parity check drives) have their check data initialized by the first data drive's data. In this case, there is a corresponding factor (that varies with each check drive) that needs to be multiplied with each of the first data drive's data bytes. This is handled by calling the Parallel Lookup Multiplier for each non-parity check drive.

In step 540, the second middle loop is called, which processes the other data drives' corresponding 64-byte chunks of data. As with the first data drive, each of the other data drives is processed separately, loading the respective 64 bytes of data into four registers (preserved across calls to the Parallel Lookup Multiplier). In addition, since the first check drive is the parity drive, its check data can be updated by directly adding these 64 bytes to it (using the Parallel Adder) before handling the non-parity check drives.

In step 550, the inner loop is called for the next data drive. In the inner loop (as with the first middle loop), each of the non-parity check drives is associated with a corresponding factor for the particular data drive. The factor is multiplied with each of the next data drive's data bytes using the Parallel Lookup Multiplier, and the results added to the check drive's check data.

Another such sequencer (Sequencer 2) can be used to reconstruct the lost data from the surviving data (using Algorithm 2). While the same column-by-column and row-by-row data access approaches are possible, as well as the same choices for handling the check drives, Algorithm 2 adds another dimension of complexity because of the four separate steps and whether to: (i) do the steps completely serially or (ii) do some of the steps concurrently on the same data. For example, step 1 (surviving check data generation) and step 4 (lost check data regeneration) can be done concurrently on the same data to reduce or minimize the number of surviving original data accesses from memory.

Empirical results show that method (2)(b)(ii), that is, row-by-row data access on all of the check drives and for both surviving check data generation and lost check data regeneration between data accesses performs best with the Parallel Lookup Multiplier when reconstructing lost data using Algorithm 2. Again, this may be due to the apparent minimization of the number of memory accesses (namely, one) of each chunk of surviving original data X to reconstruct the lost data and the absence of memory accesses of reconstructed lost original data Y when regenerating the lost check data. This embodiment of Sequencer 1 is described in more detail with reference to FIGS. 5-7.

Figure 5:
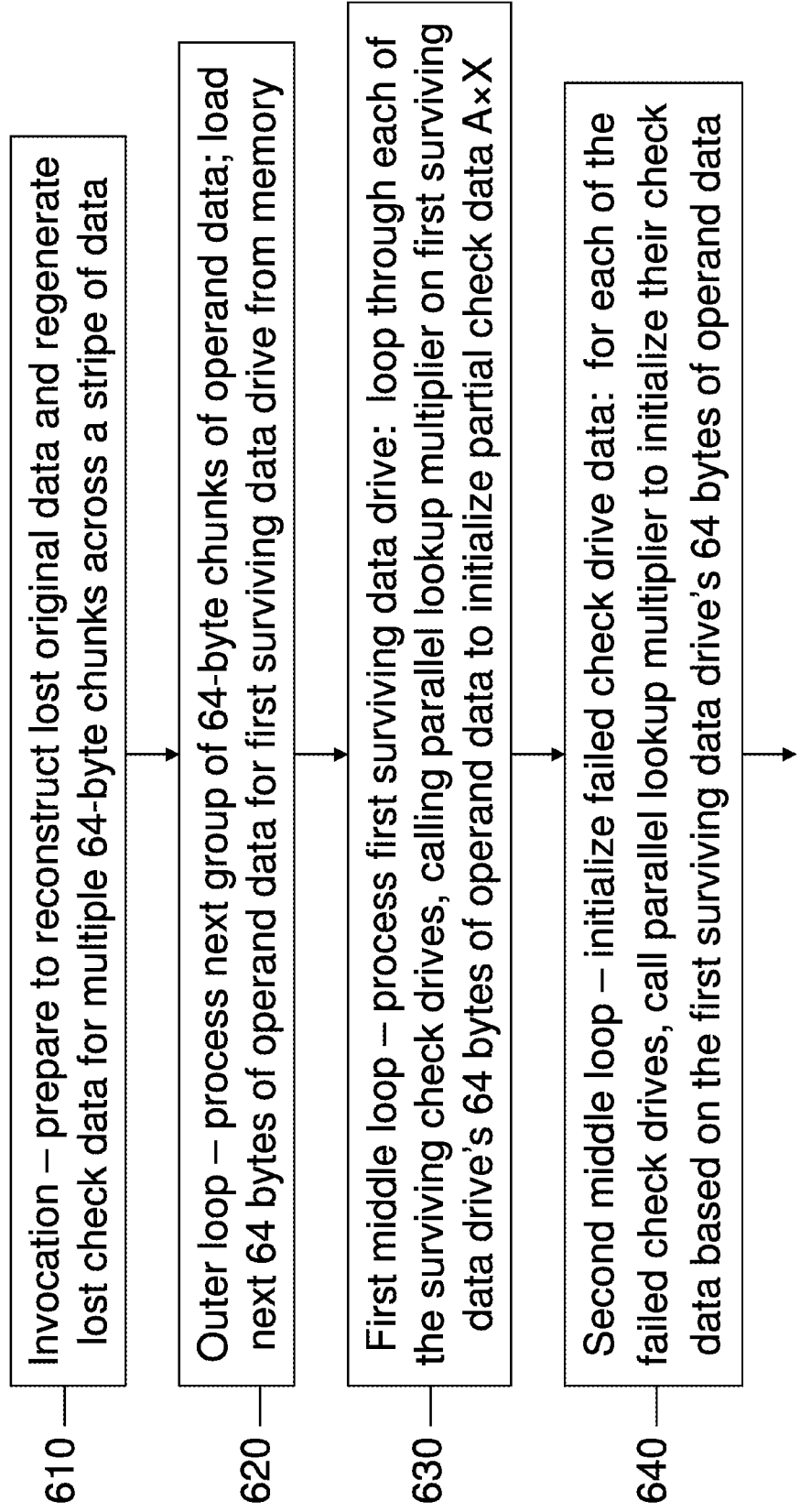
FIGS. 5-7 show an exemplary method for sequencing the parallel lookup multiplier to perform the lost data reconstruction according to an embodiment of the present invention.
Figure 6:
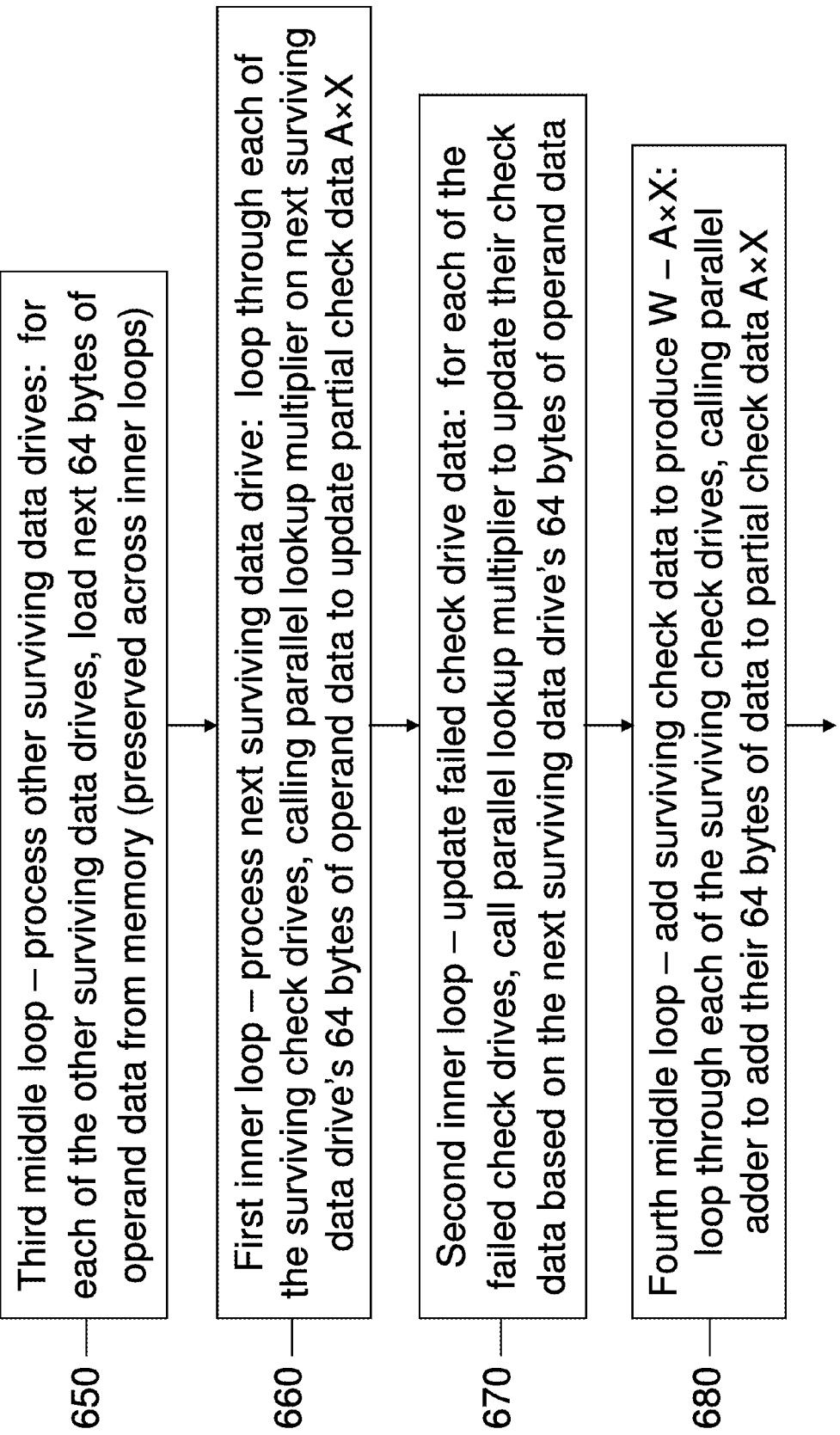
Figure 7:
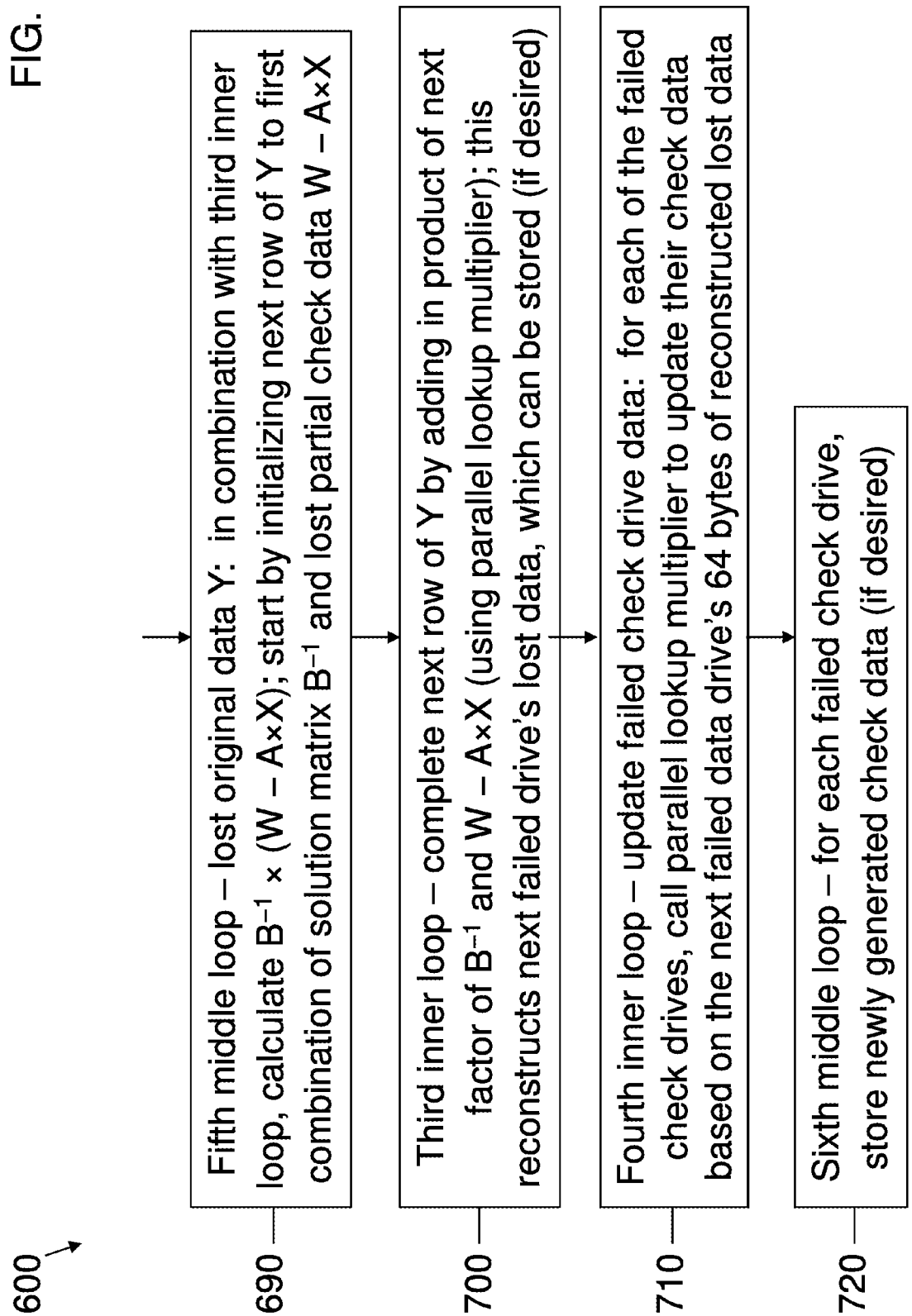

FIGS. 5-7 show an exemplary method 600 for sequencing the Parallel Lookup Multiplier to perform the lost data reconstruction according to an embodiment of the present invention.

Referring to FIG. 5, in step 610, the Sequencer 2 is called. Sequencer 2 has many similarities with the embodiment of Sequencer 1 illustrated in FIG. 4. For instance, Sequencer 2 processes the data drive data in 64-byte chunks like Sequencer 1. Sequencer 2 is more complex, however, in that only some of the data drive data is surviving; the rest has to be reconstructed. In addition, lost check data needs to be regenerated. Like Sequencer 1, Sequencer 2 does these operations in such a way as to minimize memory accesses of the data drive data (by loading the data once and calling the Parallel Lookup Multiplier multiple times). Assume for ease of description that there is at least one surviving data drive; the case of no surviving data drives is handled a little differently, but not significantly different. In addition, recall from above that the driving formula behind data reconstruction is $Y = B^{-1} \times (W - A \times X)$, where Y is the lost original data, $B^{-1}$ is the solution matrix, W is the surviving check data, A is the partial check data encoding matrix (for the surviving check drives and the surviving data drives), and X is the surviving original data.

In step 620, the outer loop processes the next 64-byte chunk of data for each of the drives. Like Sequencer 1, the first surviving data drive is again handled specially since the partial check data $A \times X$ has to be initialized for each surviving check drive.

In step 630, the first middle loop is called, in which the partial check data $A \times X$ is initialized for each surviving check drive based on the first surviving data drive's 64 bytes of data. In this case, the Parallel Lookup Multiplier is called for each surviving check drive with the corresponding factor (from A) for the first surviving data drive.

In step 640, the second middle loop is called, in which the lost check data is initialized for each failed check drive. Using the same 64 bytes of the first surviving data drive (preserved across the calls to Parallel Lookup Multiplier in step 630), the Parallel Lookup Multiplier is again called, this time to initialize each of the failed check drive's check data to the corresponding component from the first surviving data drive. This completes the computations involving the first surviving data drive's 64 bytes of data, which were fetched with one access from main memory and preserved in the same four registers across steps 630 and 640.

Continuing with FIG. 6, in step 650, the third middle loop is called, which processes the other surviving data drives' corresponding 64-byte chunks of data. As with the first surviving data drive, each of the other surviving data drives is processed separately, loading the respective 64 bytes of data into four registers (preserved across calls to the Parallel Lookup Multiplier).

In step 660, the first inner loop is called, in which the partial check data $A \times X$ is updated for each surviving check drive based on the next surviving data drive's 64 bytes of data. In this case, the Parallel Lookup Multiplier is called for each surviving check drive with the corresponding factor (from A) for the next surviving data drive.

In step 670, the second inner loop is called, in which the lost check data is updated for each failed check drive. Using the same 64 bytes of the next surviving data drive (preserved across the calls to Parallel Lookup Multiplier in step 660), the Parallel Lookup Multiplier is again called, this time to update each of the failed check drive's check data by the corresponding component from the next surviving data drive. This completes the computations involving the next surviving data drive's 64 bytes of data, which were fetched with one access from main memory and preserved in the same four registers across steps 660 and 670.

Next, in step 680, the computation of the partial check data $A \times X$ is complete, so the surviving check data W is added to this result (recall that $W - A \times X$ is equivalent to $W + A \times X$ in binary Galois Field arithmetic). This is done by the fourth middle loop, which for each surviving check drive adds the corresponding 64-byte component of surviving check data W to the (surviving) partial check data $A \times X$ (using the Parallel Adder) to produce the (lost) partial check data $W - A \times X$.

Continuing with FIG. 7, in step 690, the fifth middle loop is called, which performs the two dimensional matrix multiplication $B^{-1} \times (W - A \times X)$ to produce the lost original data Y. The calculation is performed one row at a time, for a total of F rows, initializing the row to the first term of the corresponding linear combination of the solution matrix $B^{-1}$ and the lost partial check data $W - A \times X$ (using the Parallel Lookup Multiplier).

In step 700, the third inner loop is called, which completes the remaining F−1 terms of the corresponding linear combination (using the Parallel Lookup Multiplier on each term) from the fifth middle loop in step 690 and updates the running calculation (using the Parallel Adder) of the next row of $B^{-1} \times (W-A \times X)$. This completes the next row (and reconstructs the corresponding failed data drive's lost data) of lost original data Y, which can then be stored at an appropriate location.

In step 710, the fourth inner loop is called, in which the lost check data is updated for each failed check drive by the newly reconstructed lost data for the next failed data drive. Using the same 64 bytes of the next reconstructed lost data (preserved across calls to the Parallel Lookup Multiplier), the Parallel Lookup Multiplier is called to update each of the failed check drives' check data by the corresponding component from the next failed data drive. This completes the computations involving the next failed data drive's 64 bytes of reconstructed data, which were performed as soon as the data was reconstructed and without being stored and retrieved from main memory.

Finally, in step 720, the sixth middle loop is called. The lost check data has been regenerated, so in this step, the newly regenerated check data is stored at an appropriate location (if desired).

Aspects of the present invention can be also realized in other environments, such as two-byte quantities, each such two-byte quantity capable of taking on $2^{16}=65,536$ possible values, by using similar constructs (scaled accordingly) to those presented here. Such extensions would be readily apparent to one of ordinary skill in the art, so their details will be omitted for brevity of description.

Exemplary techniques and methods for doing the Galois field manipulation and other mathematics behind RAID error correcting codes are described in Appendix A, which contains a paper "Information Dispersal Matrices for RAID Error Correcting Codes" prepared for the present application.

Multi-Core Considerations

What follows is an exemplary embodiment for optimizing or improving the performance of multi-core architecture systems when implementing the described erasure coding system routines. In multi-core architecture systems, each processor die is divided into multiple CPU cores, each with their own local caches, together with a memory (bus) interface and possible on-die cache to interface with a shared memory with other processor dies.

Figure 8:
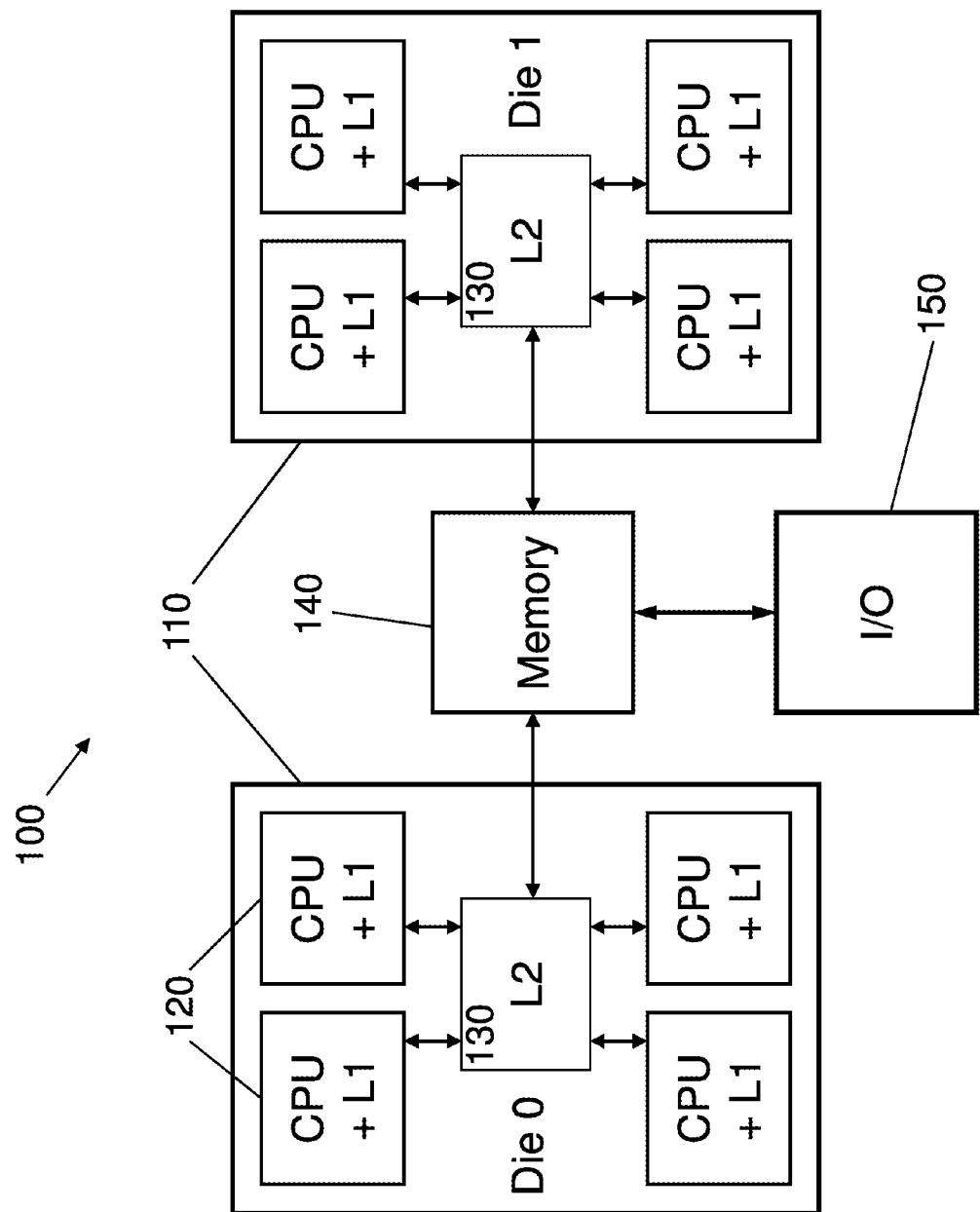
FIG. 8 illustrates a multi-core architecture system according to an embodiment of the present invention.

FIG. 8 illustrates a multi-core architecture system 100 having two processor dies 110 (namely, Die 0 and Die 1).

Referring to FIG. 8, each die 110 includes four central processing units (CPUs or cores) 120 each having a local level 1 (L1) cache. Each core 120 may have separate functional units, for example, an x86 execution unit (for traditional instructions) and a SSE execution unit (for software designed for the newer SSE instruction set). An example application of these function units is that the x86 execution unit can be used for the RAID control logic software while the SSE execution unit can be used for the GF operation software. Each die 110 also has a level 2 (L2) cache/memory bus interface 130 shared between the four cores 120. Main memory 140, in turn, is shared between the two dies 110, and is connected to the input/output (I/O) controllers 150 that access external devices such as disk drives or other non-volatile storage devices via interfaces such as Peripheral Component Interconnect (PCI).

Redundant array of independent disks (RAID) controller processing can be described as a series of states or functions. These states may include: (1) Command Processing, to validate and schedule a host request (for example, to load or store data from disk storage); (2) Command Translation and Submission, to translate the host request into multiple disk requests and to pass the requests to the physical disks; (3) Error Correction, to generate check data and reconstruct lost data when some disks are not functioning correctly; and (4) Request Completion, to move data from internal buffers to requestor buffers. Note that the final state, Request Completion, may only be needed for a RAID controller that supports caching, and can be avoided in a cacheless design.

Parallelism is achieved in the embodiment of FIG. 8 by assigning different cores 120 to different tasks. For example, some of the cores 120 can be "command cores," that is, assigned to the I/O operations, which includes reading and storing the data and check bytes to and from memory 140 and the disk drives via the I/O interface 150. Others of the cores 120 can be "data cores," and assigned to the GF operations, that is, generating the check data from the original data, reconstructing the lost data from the surviving data, etc., including the Parallel Lookup Multiplier and the sequencers described above. For example, in exemplary embodiments, a scheduler can be used to divide the original data D into corresponding portions of each block, which can then be processed independently by different cores 120 for applications such as check data generation and lost data reconstruction.

One of the benefits of this data core/command core subdivision of processing is ensuring that different code will be executed in different cores 120 (that is, command code in command cores, and data code in data cores). This improves the performance of the associated L1 cache in each core 120, and avoids the "pollution" of these caches with code that is less frequently executed. In addition, empirical results show that the dies 110 perform best when only one core 120 on each die 110 does the GF operations (i.e., Sequencer 1 or Sequencer 2, with corresponding calls to Parallel Lookup Multiplier) and the other cores 120 do the I/O operations. This helps localize the Parallel Lookup Multiplier code and associated data to a single core 120 and not compete with other cores 120, while allowing the other cores 120 to keep the data moving between memory 140 and the disk drives via the I/O interface 150.

Embodiments of the present invention yield scalable, high performance RAID systems capable of outperforming other systems, and at much lower cost, due to the use of high volume commodity components that are leveraged to achieve the result. This combination can be achieved by utilizing the mathematical techniques and code optimizations described elsewhere in this application with careful placement of the resulting code on specific processing cores. Embodiments can also be implemented on fewer resources, such as single-core dies and/or single-die systems, with decreased parallelism and performance optimization.

The process of subdividing and assigning individual cores 120 and/or dies 110 to inherently parallelizable tasks will result in a performance benefit. For example, on a Linux system, software may be organized into "threads," and threads may be assigned to specific CPUs and memory systems via the kthread bind function when the thread is created. Creating separate threads to process the GF arithmetic allows parallel computations to take place, which multiplies the performance of the system.

Further, creating multiple threads for command processing allows for fully overlapped execution of the command processing states. One way to accomplish this is to number each command, then use the arithmetic MOD function (% in C language) to choose a separate thread for each command. Another technique is to subdivide the data processing portion of each command into multiple components, and assign each component to a separate thread.

FIG. 9 shows an exemplary disk drive configuration 200 according to an embodiment of the present invention.

Referring to FIG. 9, eight disks are shown, though this number can vary in other embodiments. The disks are divided into three types: data drives 210, parity drive 220, and check drives 230. The eight disks break down as three data drives 210, one parity drive 220, and four check drives 230 in the embodiment of FIG. 9.

Each of the data drives 210 is used to hold a portion of data. The data is distributed uniformly across the data drives 210 in stripes, such as 192 KB stripes. For example, the data for an application can be broken up into stripes of 192 KB, and each of the stripes in turn broken up into three 64 KB blocks, each of the three blocks being written to a different one of the three data drives 210.

The parity drive 220 is a special type of check drive in that the encoding of its data is a simple summation (recall that this is exclusive OR in binary GF arithmetic) of the corresponding bytes of each of the three data drives 210. That is, check data generation (Sequencer 1) or regeneration (Sequencer 2) can be performed for the parity drive 220 using the Parallel Adder (and not the Parallel Lookup Multiplier). Accordingly, the check data for the parity drive 220 is relatively straightforward to build. Likewise, when one of the data drives 210 no longer functions correctly, the parity drive 220 can be used to reconstruct the lost data by adding (same as subtracting in binary GF arithmetic) the corresponding bytes from each of the two remaining data drives 210. Thus, a single drive failure of one of the data drives 210 is very straightforward to handle when the parity drive 220 is available (no Parallel Lookup Multiplier). Accordingly, the parity drive 220 can replace much of the GF multiplication operations with GF addition for both check data generation and lost data reconstruction.

Each of the check drives 230 contains a linear combination of the corresponding bytes of each of the data drives 210. The linear combination is different for each check drive 230, but in general is represented by a summation of different multiples of each of the corresponding bytes of the data drives 210 (again, all arithmetic being GF arithmetic). For example, for the first check drive 230, each of the bytes of the first data drive 210 could be multiplied by 4, each of the bytes of the second data drive 210 by 3, and each of the bytes of the third data drive 210 by 6, then the corresponding products for each of the corresponding bytes could be added to produce the first check drive data. Similar linear combinations could be used to produce the check drive data for the other check drives 230. The specifics of which multiples for which check drive are explained in Appendix A.

With the addition of the parity drive 220 and check drives 230, eight drives are used in the RAID system 200 of FIG. 9. Accordingly, each 192 KB of original data is stored as 512 KB (i.e., eight blocks of 64 KB) of (original plus check) data. Such a system 200, however, is capable of recovering all of the original data provided any three of these eight drives survive. That is, the system 200 can withstand a concurrent failure of up to any five drives and still preserve all of the original data.

Exemplary Routines to Implement an Embodiment

The error correcting code (ECC) portion of an exemplary embodiment of the present invention may be written in software as, for example, four functions, which could be named as ECCInitialize, ECCSolve, ECCGenerate, and ECCRegenerate. The main functions that perform work are ECCGenerate and ECCRegenerate. ECCGenerate generates check codes for data that are used to recover data when a drive suffers an outage (that is, ECCGenerate generates the check data J from the original data D using Sequencer 1). ECCRegenerate uses these check codes and the remaining data to recover data after such an outage (that is, ECCRegenerate uses the surviving check data W, the surviving original data X, and Sequencer 2 to reconstruct the lost original data Y while also regenerating any of the lost check data). Prior to calling either of these functions, ECCSolve is called to compute the constants used for a particular configuration of data drives, check drives, and failed drives (for example, ECCSolve builds the solution matrix $B^{-1}$ together with the lists of surviving and failed data and check drives). Prior to calling ECCSolve, ECCInitialize is called to generate constant tables used by all of the other functions (for example, ECCInitialize builds the IDM E and the two lookup tables for the Parallel Lookup Multiplier).

ECCInitialize

The function ECCInitialize creates constant tables that are used by all subsequent functions. It is called once at program initialization time. By copying or precomputing these values up front, these constant tables can be used to replace more time-consuming operations with simple table look-ups (such as for the Parallel Lookup Multiplier). For example, four tables useful for speeding up the GF arithmetic include:

1. mvct—an array of constants used to perform GF multiplication with the
   PSHUFB instruction that operates on SSE registers (that is, the Parallel Lookup Multiplier).
2. mast—contains the master encoding matrix S (or the Information Dispersal Matrix (IDM) E, as described in Appendix A), or at least the nontrivial portion, such as the check drive encoding matrix H
3. mul_tab—contains the results of all possible GF multiplication operations of any two operands (for example, 256×256=65,536 bytes for all of the possible products of two different one-byte quantities)
4. div_tab—contains the results of all possible GF division operations of any two operands (can be similar in size to mul_tab)

ECCSolve

The function ECCSolve creates constant tables that are used to compute a solution for a particular configuration of data drives, check drives, and failed drives. It is called prior to using the functions ECCGenerate or ECCRegenerate. It allows the user to identify a particular case of failure by describing the logical configuration of data drives, check drives, and failed drives. It returns the constants, tables, and lists used to either generate check codes or regenerate data. For example, it can return the matrix B that needs to be inverted as well as the inverted matrix $B^{-1}$ (i.e., the solution matrix).

ECCGenerate

The function ECCGenerate is used to generate check codes (that is, the check data matrix J) for a particular configuration of data drives and check drives, using Sequencer 1 and the Parallel Lookup Multiplier as described above. Prior to calling ECCGenerate, ECCSolve is called to compute the appropriate constants for the particular configuration of data drives and check drives, as well as the solution matrix $B^{-1}$.

ECCRegenerate

The function ECCRegenerate is used to regenerate data vectors and check code vectors for a particular configuration of data drives and check drives (that is, reconstructing the original data matrix D from the surviving data matrix X and the surviving check matrix W, as well as regenerating the lost check data from the restored original data), this time using Sequencer 2 and the Parallel Lookup Multiplier as described above. Prior to calling ECCRegenerate, ECC-Solve is called to compute the appropriate constants for the particular configuration of data drives, check drives, and failed drives, as well as the solution matrix $B^{-1}$.

Exemplary Implementation Details

As discussed in Appendix A, there are two significant sources of computational overhead in erasure code processing (such as an erasure coding system used in RAID processing): the computation of the solution matrix $B^{-1}$ for a given failure scenario, and the byte-level processing of encoding the check data J and reconstructing the lost data after a lost packet (e.g., data drive failure). By reducing the solution matrix $B^{-1}$ to a matrix inversion of a F×F matrix, where F is the number of lost packets (e.g., failed drives), that portion of the computational overhead is for all intents and purposes negligible compared to the megabytes (MB), gigabytes (GB), and possibly terabytes (TB) of data that needs to be encoded into check data or reconstructed from the surviving original and check data. Accordingly, the remainder of this section will be devoted to the byte-level encoding and regenerating processing.

As already mentioned, certain practical simplifications can be assumed for most implementations. By using a Galois field of 256 entries, byte-level processing can be used for all of the GF arithmetic. Using the master encoding matrix S described in Appendix A, any combination of up to 127 data drives, 1 parity drive, and 128 check drives can be supported with such a Galois field. While, in general, any combination of data drives and check drives that adds up to 256 total drives is possible, not all combinations provide a parity drive when computed directly. Using the master encoding matrix S, on the other hand, allows all such combinations (including a parity drive) to be built (or simply indexed) from the same such matrix. That is, the appropriate sub-matrix (including the parity drive) can be used for configurations of less than the maximum number of drives.

In addition, using the master encoding matrix S permits further data drives and/or check drives can be added without requiring the recomputing of the IDM E (unlike other proposed solutions, which recompute E for every change of N or M). Rather, additional indexing of rows and/or columns of the master encoding matrix S will suffice. As discussed above, the use of the parity drive can eliminate or significantly reduce the somewhat complex GF multiplication operations associated with the other check drives and replaces them with simple GF addition (bitwise exclusive OR in binary Galois fields) operations. It should be noted that master encoding matrices with the above properties are possible for any power-of-two number of drives $2^P=N_{max}+M_{max}$ where the maximum number of data drives $N_{max}$ is one less than a power of two (e.g., $N_{max}=127$ or 63) and the maximum number of check drives $M_{max}$ (including the parity drive) is $2^P-N_{max}$.

As discussed earlier, in an exemplary embodiment of the present invention, a modern x86 architecture is used (being readily available and inexpensive). In particular, this architecture supports 16 XMM registers and the SSE instructions. Each XMM register is 128 bits and is available for special purpose processing with the SSE instructions. Each of these XMM registers holds 16 bytes (8-bit), so four such registers can be used to store 64 bytes of data. Thus, by using SSE instructions (some of which work on different operand sizes, for example, treating each of the XMM registers as containing 16 one-byte operands), 64 bytes of data can be operated at a time using four consecutive SSE instructions (e.g., fetching from memory, storing into memory, zeroing, adding, multiplying), the remaining registers being used for intermediate results and temporary storage. With such an architecture, several routines are useful for optimizing the byte-level performance, including the Parallel Lookup Multiplier, Sequencer 1, and Sequencer 2 discussed above.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

GLOSSARY OF SOME VARIABLES

A encoding matrix (F×K), sub-matrix of T
B encoding matrix (F×F), sub-matrix of T
$B^{-1}$ solution matrix (F×F)
C encoded data matrix $$((N+M) \times L) = \begin{bmatrix} D \\ J \end{bmatrix}$$

C' surviving encoded data matrix $$(N \times L) = \begin{bmatrix} X \\ W \end{bmatrix}$$

D original data matrix (N×L)
D' permuted original data matrix $$(N \times L) = \begin{bmatrix} X \\ Y \end{bmatrix}$$

E information dispersal matrix (IDM)

$$((N+M) \times N) = \begin{bmatrix} I_N \\ H \end{bmatrix}$$

F number of failed data drives
G number of failed check drives
H check drive encoding matrix (M×N)
I identity matrix ($I_K$=K×K identity matrix, $I_N$=N×N identity matrix)
J encoded check data matrix (M×L)
K number of surviving data drives=N−F
L data block size (elements or bytes)
M number of check drives
$M_{max}$ maximum value of M
N number of data drives
$N_{max}$ maximum value of N
O zero matrix (K×F), sub-matrix of T
S master encoding matrix (($M_{max}+N_{max}$)×$N_{max}$)
T transformed IDM $$(N \times N) = \begin{bmatrix} I_K & O \\ A & B \end{bmatrix}$$

W surviving check data matrix (F×L)
X surviving original data matrix (K×L)
Y lost original data matrix (F×L)

What is claimed is:

1. A non-volatile storage medium storing a plurality of computer instructions that, when executed by a processor, cause the processor to:
compute at least one block of check data based on a data matrix comprising at least one block of original data and an encoding matrix comprising a plurality of factors using a thread comprising:
a Galois Field multiplier configured to multiply at least one vector of the data matrix by a single factor of the plurality of factors of the encoding matrix to compute a plurality of Galois Field multiplier results;
a Galois Field adder configured to compute a running total of the Galois Field multiplier results; and
a sequencer configured to:
order load operations of the original data into at least one of a plurality of vector registers of the processor;
compute the check data using the Galois Field multiplier and the Galois Field adder; and
store the computed check data from the vector registers of the processor into a check matrix in a memory, one row of the check matrix comprising a parity row comprising a Galois Field summation of all of the rows of the data matrix.

2. The non-volatile storage medium of claim 1 further storing computer instructions that, when executed by the processor, cause the processor to:
load the at least one block of the original data into the data matrix, the data matrix being stored in a memory; and
load the encoding matrix into the memory.

3. The non-volatile storage medium of claim 2,
wherein the thread comprises a plurality of threads, and
wherein the non-volatile storage medium further stores computer instructions that, when executed by the processor, cause the processor to execute a scheduler configured to generate check data across the plurality of threads by:
dividing the original data in the memory into a plurality of data matrices;
dividing the check data in the memory into a plurality of check matrices;
assigning corresponding ones of the data matrices and the check matrices in the memory to the plurality of threads, wherein each thread comprises an encoder, the encoder comprising at least a portion of the encoding matrix, a Galois Field multiplier, a Galois Field adder, and a sequencer for ordering operations through at least one of the data matrices, corresponding ones of the check matrices, and the at least a portion of the encoding matrix in the memory using the Galois Field multiplier and the Galois Field adder to generate the check data in the memory; and
assigning the plurality of threads to a plurality of cores of the processor to concurrently generate the check matrices in the memory from corresponding ones of the data matrices in the memory.

4. The non-volatile storage medium of claim 3, wherein the scheduler divides the original data in the memory and the check data in the memory into a plurality of stripes, each of the plurality of stripes comprising at least:
one block of the original data; and
one corresponding block of the check data.

5. The non-volatile storage medium of claim 4, wherein the scheduler assigns the plurality of stripes to the plurality of threads such that, for each stripe of the plurality of stripes, the check data of the stripe is computed by no more than one of the plurality of threads.

6. The non-volatile storage medium of claim 5, wherein each of the plurality of threads corresponding to at least one of the plurality of stripes is assigned to a respective one of the plurality of cores of the processor.

7. The non-volatile storage medium of claim 1, wherein the data matrix comprises a first number of rows corresponding to a plurality of data drives, each of the data drives comprising at least one non-volatile storage medium, the data drives storing the at least one block of original data,
wherein the check matrix comprises a second number of rows corresponding to a plurality of check drives, each of check drives comprising at least one non-volatile storage medium storing the at least one block of check data corresponding to the at least one block of the original data, the second number being at least four, and
wherein the encoding matrix comprises a plurality of first factors in the second number of rows and the first number of columns.

8. The non-volatile storage medium of claim 1,
wherein the thread comprises a plurality of threads comprising a first thread group and a second thread group, and
wherein the non-volatile storage medium further stores computer instructions that, when executed by the processor, cause the processor to perform data operations to compute the check data and to perform I/O operations using an input/output (I/O) controller by:
assigning the data operations to the first thread group, and not assigning the I/O operations to the first thread group;
assigning the I/O operations to the second thread group, and not assigning the data operations to the second thread group;
assigning the first thread group to a first core of the processor;
assigning the second thread group to a second core of the processor; and
concurrently executing the first thread group on the first core and the second thread group on the second core to concurrently generate the check data and perform the I/O operations.

9. The non-volatile storage medium of claim 1, wherein the Galois Field multiplier multiplies the at least one vector of the data matrix by the single factor in the encoding matrix at a rate of less than about 2 machine instructions per byte of the data matrix.

10. A non-volatile storage medium storing computer instructions that, when executed by a processor, cause the processor to:
reconstruct at least one block of lost original data based on a data matrix comprising at least one block of surviving original data, a check matrix comprising at least one block of surviving check data, and a solution matrix comprising a plurality of factors using a thread comprising:
a Galois Field multiplier configured to multiply at least one vector of the data matrix by a single factor of the plurality of factors of the solution matrix to compute a plurality of Galois Field multiplier results;
a Galois Field adder configured to compute a running total of the Galois Field multiplier results; and
a sequencer configured to:
order load operations of the surviving original data into at least one of a plurality of vector registers of the processor and load operations of the surviving check data into at least one of the vector registers of the processor;

compute the lost original data using the Galois Field multiplier and the Galois Field adder; and store the lost original data from the vector registers into a memory.

11. The non-volatile storage medium of claim 10, further storing computer instructions that, when executed by the processor, cause the processor to:

load the at least one block of the surviving original data into the data matrix, the data matrix being stored in the memory;

load the at least one block of surviving check data into the check matrix, the check matrix being stored in the memory; and load the solution matrix into the memory.

12. The non-volatile storage medium of claim 11, wherein the thread comprises a plurality of threads, wherein the non-volatile storage medium further stores computer instructions that, when executed by the processor, cause the processor to execute a scheduler configured to compute the lost original data across the plurality of threads by:

dividing the surviving original data in the memory into a plurality of data matrices;

dividing the surviving check data in the memory into a plurality of check matrices;

assigning corresponding ones of the data matrices and the check matrices in the memory to the plurality of threads, wherein each thread comprises an decoder, the decoder comprising at least a portion of the solution matrix, a Galois Field multiplier, a Galois Field adder, and a sequencer for ordering operations through at least one of the data matrices, corresponding ones of the check matrices, and the at least a portion of the solution matrix in the memory using the Galois Field multiplier and the Galois Field adder to decode the check data in the memory into the lost original data in the memory; and assigning the plurality of threads to a plurality of cores of the processor to concurrently regenerate portions of the data matrices corresponding to the lost original data in the memory from corresponding ones of the check matrices in the memory.

13. The non-volatile storage medium of claim 12, wherein the scheduler divides the surviving original data in the memory and the check data in the memory into a plurality of stripes, each of the plurality of stripes comprising at least:

one block of the surviving original data; and one corresponding block of the check data.

14. The non-volatile storage medium of claim 13, wherein the scheduler assigns the stripes to the plurality of threads such that, for each stripe of the plurality of stripes, the decoding of the check data of the stripe corresponding to the lost original data is computed by no more than one of the plurality of threads.

15. The non-volatile storage medium of claim 14, wherein each of the plurality of threads corresponding to at least one of the plurality of stripes is assigned to a respective one of the plurality of cores of the processor.

16. The non-volatile storage medium of claim 10, wherein the thread comprises a plurality of threads comprising a first thread group and a second thread group, and wherein the non-volatile storage medium further stores computer instructions that, when executed by the processor, cause the processor to perform data operations to regenerate the lost original data and to perform I/O operations using an input/output (I/O) controller by:

assigning the data operations to the first thread group, and not assigning the I/O operations to the first thread group;

assigning the I/O operations to the second thread group, and not assigning the data operations to the second thread group;

assigning the first thread group to a first core of the processor;

assigning the second thread group to a second core of the processor; and concurrently executing the first thread group on the first core and the second thread group on the second core to concurrently regenerate the lost original data and perform the I/O operations.

17. The non-volatile storage medium of claim 10, wherein the Galois Field multiplier multiplies the at least one vector of the data matrix by the single factor in the solution matrix at a rate of less than about 2 machine instructions per byte of the data matrix.

18. The non-volatile storage medium of claim 10, wherein the solution matrix comprises an inverted sub-matrix of an encoding matrix, the factors of the encoding matrix being for encoding the original data into the check data.

* * * * *